(12) United States Patent
Brown et al.

(10) Patent No.: US 10,049,862 B2
(45) Date of Patent: Aug. 14, 2018

(54) CHAMBER WITH VERTICAL SUPPORT STEM FOR SYMMETRIC CONDUCTANCE AND RF DELIVERY

(71) Applicant: Lam Research Corporation, Fremont, CA (US)

(72) Inventors: Daniel Arthur Brown, Brentwood, CA (US); John Patrick Holland, San Jose, CA (US); Michael C. Kellogg, San Francisco, CA (US); James E. Tappan, Fremont, CA (US); Jerrel K. Antolik, Livermore, CA (US); Ian Kenworthy, Santa Clara, CA (US); Theo Panagopoulos, San Jose, CA (US); Zhigang Chen, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 113 days.

(21) Appl. No.: 15/068,508

(22) Filed: Mar. 11, 2016

(65) Prior Publication Data
US 2016/0307743 A1 Oct. 20, 2016

Related U.S. Application Data

(60) Provisional application No. 62/149,493, filed on Apr. 17, 2015.

(51) Int. Cl.
*H01J 37/32* (2006.01)
(52) U.S. Cl.
CPC .. *H01J 37/32816* (2013.01); *H01J 37/32082* (2013.01); *H01J 37/32183* (2013.01); *H01J 37/32651* (2013.01); *H01J 37/32724* (2013.01)

(58) Field of Classification Search
None
See application file for complete search history.

(56) References Cited

U.S. PATENT DOCUMENTS

| 5,716,451 A | 2/1998 | Hama et al. | |
| 5,761,023 A * | 6/1998 | Lue | G03F 7/707 361/233 |
| 6,267,074 B1 * | 7/2001 | Okumura | C23C 16/5096 118/723 ER |
| 6,506,254 B1 * | 1/2003 | Bosch | H01J 37/32477 118/715 |
| 6,890,861 B1 * | 5/2005 | Bosch | C04B 41/0054 427/534 |

(Continued)

FOREIGN PATENT DOCUMENTS

WO 2002057506 A2 7/2002

*Primary Examiner* — Douglas W Owens
*Assistant Examiner* — Srinivas Sathiraju
(74) *Attorney, Agent, or Firm* — Martine Penilla Group, LLP

(57) ABSTRACT

A plasma chamber is provided to increase conductance within the plasma chamber and to increase uniformity of the conductance. A radio frequency (RF) path for supplying power to the plasma chamber is symmetric with respect to a center axis of the plasma chamber. Moreover, pumps used to remove materials from the plasma chamber are located symmetric with respect to the center axis. The symmetric arrangements of the RF paths and the pumps facilitate an increase in conductance uniformity within the plasma chamber.

25 Claims, 18 Drawing Sheets

(56) References Cited

U.S. PATENT DOCUMENTS

| | | | | |
|---|---|---|---|---|
| 7,722,778 B2* | 5/2010 | Fischer | ............... | H01J 37/304 118/702 |
| 8,334,015 B2* | 12/2012 | Chiang | ............. | C23C 16/45544 117/102 |
| 8,895,452 B2* | 11/2014 | Antolik | ............. | H01J 37/32091 118/728 |
| 8,900,402 B2* | 12/2014 | Holland | ............ | H01J 37/32633 156/345.29 |
| 9,502,216 B2 | 11/2016 | Valcore, Jr. et al. | | |
| 2004/0149389 A1* | 8/2004 | Fink | ................. | H01J 37/32642 156/345.51 |
| 2008/0230518 A1* | 9/2008 | Brillhart | ........... | C23C 16/45502 216/58 |
| 2009/0061544 A1* | 3/2009 | Holland | ............ | H01J 37/32935 438/14 |
| 2009/0199665 A1* | 8/2009 | Tappan | ................... | F16H 25/24 74/89.32 |
| 2009/0199766 A1* | 8/2009 | Tappan | ............. | H01J 37/32091 118/723 I |
| 2009/0200268 A1* | 8/2009 | Tappan | ............. | H01J 37/32091 216/67 |
| 2009/0301657 A1* | 12/2009 | Tappan | ............. | H01J 37/32522 156/345.43 |
| 2011/0162803 A1* | 7/2011 | Palagashvili | ..... | H01J 37/32091 156/345.54 |
| 2011/0180243 A1* | 7/2011 | Bera | ........................ | F28F 3/12 165/168 |
| 2012/0223048 A1* | 9/2012 | Paranjpe | ............... | C23C 14/042 216/22 |
| 2013/0126513 A1* | 5/2013 | Marakhtanov | ........... | H05B 7/18 219/383 |
| 2013/0134876 A1* | 5/2013 | de la Llera | ....... | H01J 37/32082 315/111.21 |
| 2013/0323860 A1* | 12/2013 | Antolik | ............. | H01J 37/32091 438/14 |
| 2014/0034612 A1 | 2/2014 | Yang et al. | | |
| 2015/0004721 A1* | 1/2015 | Akimoto | ........... | H01J 37/32926 438/9 |
| 2015/0041062 A1* | 2/2015 | Kellogg | ............ | H01J 37/32458 156/345.48 |
| 2015/0047785 A1* | 2/2015 | Kellogg | ............ | H01J 37/32816 156/345.1 |
| 2015/0083690 A1* | 3/2015 | Chen | ................. | H01J 37/32091 216/67 |
| 2015/0372119 A1* | 12/2015 | Zhang | ................... | B82Y 10/00 438/268 |
| 2016/0064196 A1* | 3/2016 | Okita | ...................... | H01L 21/78 216/58 |
| 2016/0064198 A1* | 3/2016 | Okita | ................ | H01J 37/32724 216/45 |

* cited by examiner

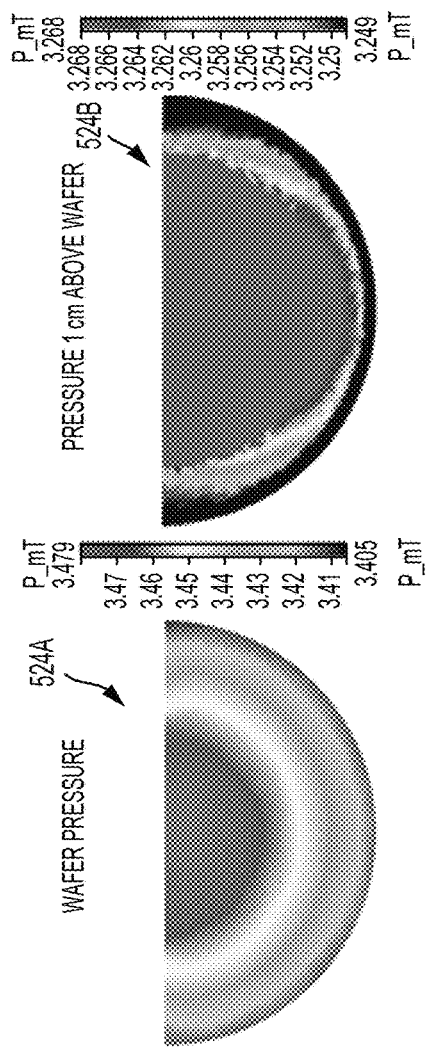
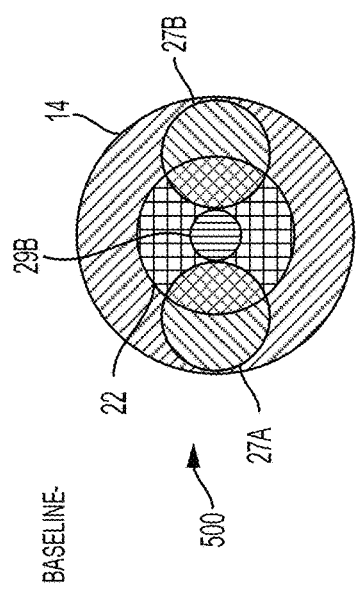
FIG. 5C
FIG. 5B
FIG. 5A

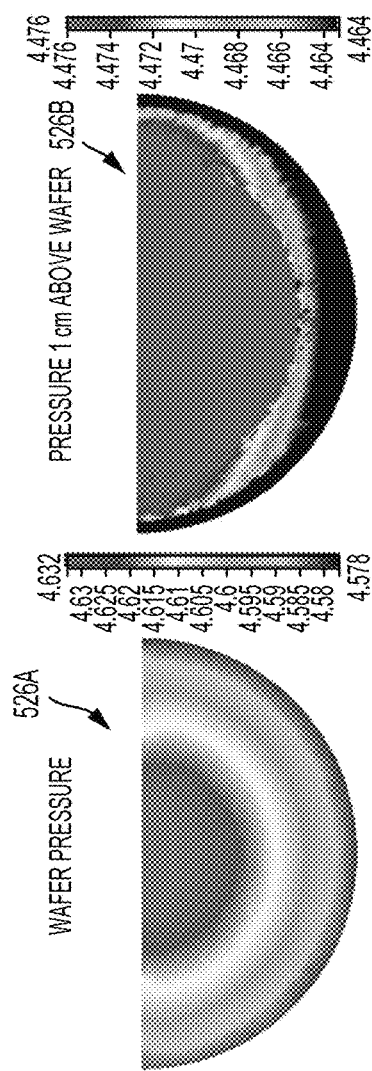
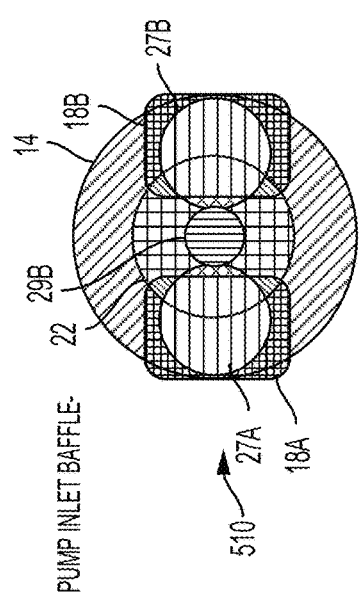
FIG. 5F
FIG. 5E
FIG. 5D

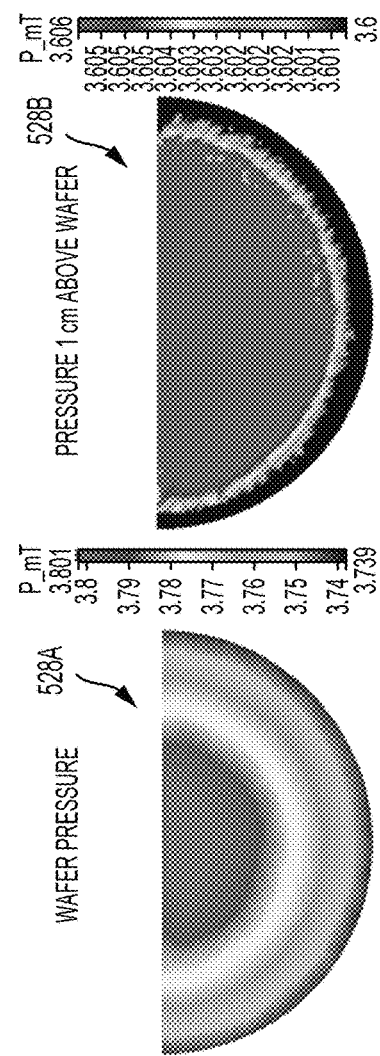
FIG. 5I
FIG. 5H
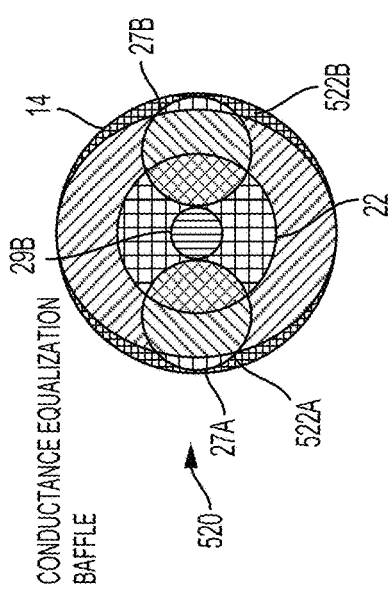
FIG. 5G

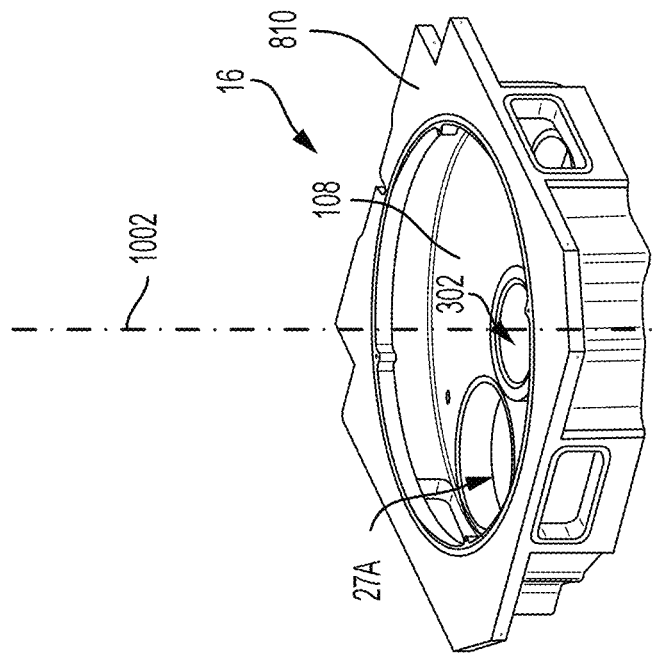
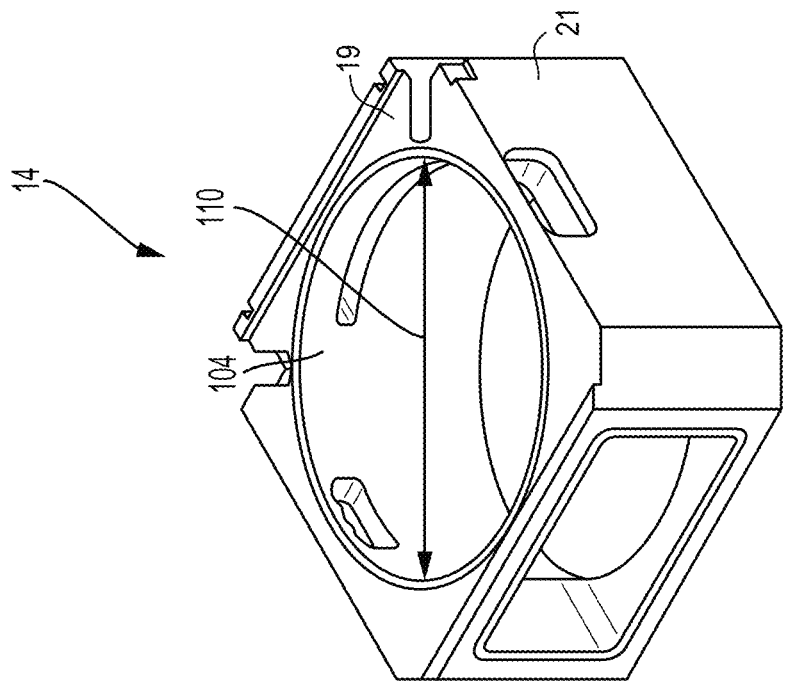
FIG. 8A
FIG. 8B

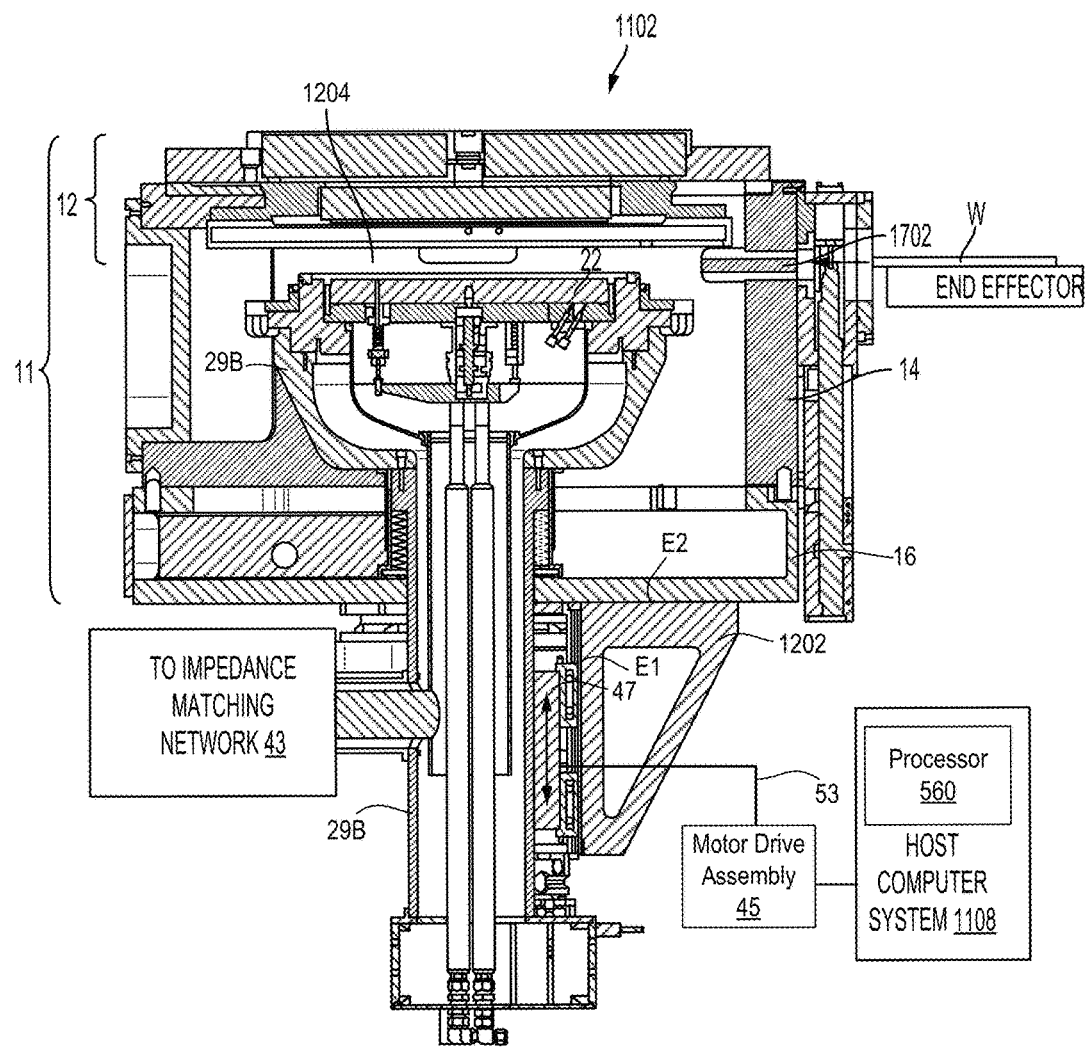
FIG. 12 (Transport Position)

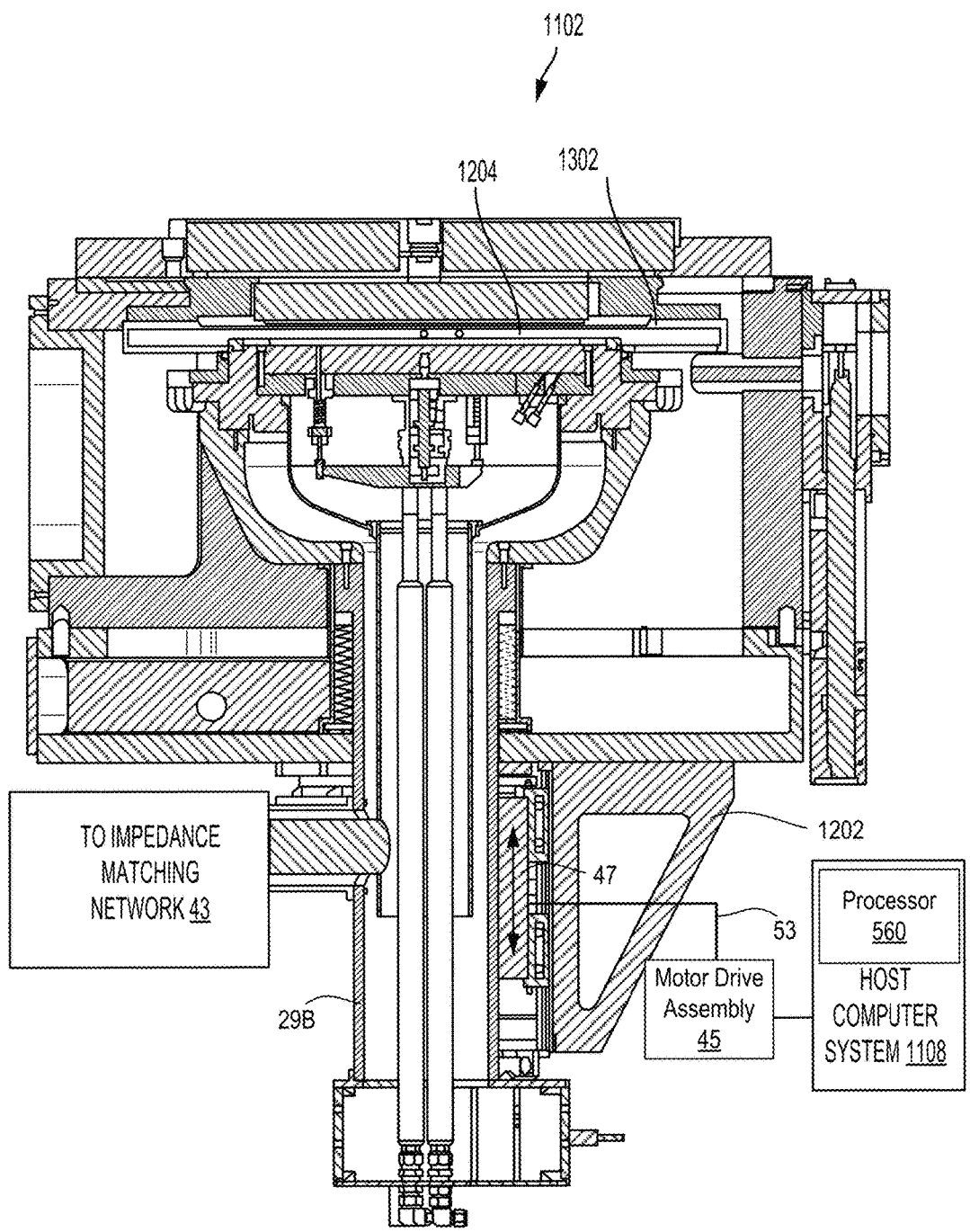
FIG. 13 (Process Position)

CHAMBER WITH VERTICAL SUPPORT STEM FOR SYMMETRIC CONDUCTANCE AND RF DELIVERY

CLAIM OF PRIORITY

The present patent application claims the benefit of and priority, under 35 U.S.C. § 119(e), to U.S. Provisional Patent Application No. 62/149,493, filed on Apr. 17, 2015, and titled "Chamber With Vertical Support Stem for Symmetric Conductance and RF Delivery", which is incorporated by reference herein in its entirety for all purposes.

FIELD

The present embodiments relate to a symmetric chamber design that enables symmetric conductance and symmetric delivery of radio frequency (RF) to a chuck.

BACKGROUND

A plasma system includes a plasma chamber and one or more radio frequency (RF) generators. The one or more RF generators supply power to the plasma chamber to form plasma within the plasma chamber. The RF power is supplied via an impedance matching circuit and an RF transmission line. The plasma and/or materials remaining in the plasma chamber are removed using a pump. The plasma is used to process a wafer.

The arrangement of components in the plasma system, if not appropriate, results in irregular processing of the wafer. Moreover, the removal of the materials and/or plasma, if not done properly, negatively affects the processing of the wafer.

It is in this context that embodiments described in the present disclosure arise.

SUMMARY

Embodiments of the disclosure provide apparatus, methods and computer programs for providing a high conductance chamber with radio frequency (RF) symmetry. It should be appreciated that the present embodiments can be implemented in numerous ways, e.g., a process, an apparatus, a system, a piece of hardware, or a method on a computer-readable medium. Several embodiments are described below.

With an increase in a size of a wafer, e.g., from 300 millimeter (mm) to 450 mm, there is an increase in a size of a plasma chamber that is used to hold and process the wafer. Examples of processing the wafer include etching the wafer, depositing monomers or polymers on the wafer, cleaning the wafer, sputtering the wafer, etc. The plasma chamber is increased in size to increase a conductance of remnant materials, e.g., etch materials, plasma, deposition materials, etc., from the plasma chamber to outside the plasma chamber and to accommodate the wafer.

In some embodiments, the plasma chamber is of a large inner diameter with provisions for multiple vacuum pumps to be mounted at a base of the plasma chamber and has a centrally mounted pedestal, e.g., cathode, chuck, lower electrode, etc. The inner diameter is larger than that used to process a wafer of 300 mm. Generally, an inner surface of a side wall of the plasma chamber is cylindrical, but an outer surface of side wall is of other shapes, e.g., square or rectangular, etc. The inner diameter of the plasma chamber and an outer diameter of the pedestal are chosen to maximize flow conductance between a plane of the wafer and a bottom surface of the plasma chamber.

With the increase in the size of the plasma chamber, it is more difficult to process the wafer uniformly. In some embodiments, RF power is symmetrically provided to the wafer for striking plasma or maintaining plasma within the plasma chamber. For example, the RF power is symmetrically provided by arranging an RF rod around a center axis that passes via a center of a lower electrode. To illustrate, the RF rod is not bent to reduce chances of reducing symmetry of conductance of the remnant materials from the plasma chamber to outside the plasma chamber. Moreover, after or during processing of the wafer, the remnant materials are removed from the plasma chamber in a symmetric fashion. Such removal facilitates uniformity in processing of the wafer. The removal is facilitated by placing the vacuum pumps symmetric with respect to the center axis.

In various embodiments, the RF rod that is centrally mounted includes provisions for other facilities, e.g. electrostatic chuck (ESC) cooling fluid, thermocouple direct current (DC) voltage, helium delivery, ESC heater power, etc., to be delivered to the pedestal.

In some embodiments, a symmetry of flow of the remnant materials in the plasma chamber, also sometimes referred as conductance or pumping symmetry, is provided along with symmetry delivery of RF power to the wafer within the plasma chamber. The systems and methods, described herein, increase conductance at a plane, e.g., top surface, etc., of the wafer while also improving a symmetry of conductance and at the same time creating a symmetric RF feed structure that enables a symmetric delivery of RF power to the wafer.

In various embodiments, a drive mechanism is provided to move the pedestal and the RF rod in a vertical direction to vary a position of the wafer at different times in a processing sequence. In one embodiment, the drive mechanism is a linear drive mechanism that allows for vertical movement of a vertical support stem. The movement up or down is to load and unload the wafer or to change a height of the pedestal during processing of the wafer.

In some embodiments, the plasma chamber, in some embodiments, includes a grid, e.g., a shield, etc., to separate a process region between the pedestal and an upper electrode from a cylindrical region, e.g., space, etc., around the pedestal that creates a conductance path from the process region of the plasma chamber to the cylindrical region. A size of openings in the grid is selected to set or adjust conductance between the process region and the cylindrical region.

Some advantages of the herein described systems and methods include providing a symmetric RF delivery to the pedestal and also a symmetric conductance of the remnant materials from the plasma chamber. Additional advantages of the herein described systems and methods include controlling the movement of the pedestal and the RF rod in the vertical direction. The movement in the vertical direction facilitates achievement of symmetry in conductance and symmetry in the delivery of RF power to the pedestal. The symmetric RF delivery and the symmetry in conductance facilitate achieving uniformity in the processing of the wafer.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 5A is a top view of an embodiment of the plasma system to illustrate use of the chuck support column without a baffle.

FIG. 5B is an embodiment of a pressure plot at a top surface of the wafer when the baffle is not used in the plasma system.

FIG. 5C is an embodiment of a pressure plot at a pre-determined distance from the top surface of the wafer when the baffle is not used in the plasma system.

FIG. 5D is a top view of an embodiment of the plasma system to illustrate use of the chuck support column with the baffle.

FIG. 5E is an embodiment of a pressure plot at the top surface of the wafer when the baffle is used in the plasma system.

FIG. 5F is an embodiment of a pressure plot at the pre-determined distance from the top surface of the wafer when the baffle is used in the plasma system.

FIG. 5G is a top view of an embodiment of the plasma system to illustrate use of the chuck support column with another baffle.

FIG. 5H is an embodiment of a pressure plot at the top surface of the wafer when the other baffle is used in the plasma system.

FIG. 5I is an embodiment of a pressure plot at the pre-determined distance from the top surface of the wafer when the other baffle is used in the plasma system.

FIG. 8A is an isometric view of an embodiment of the side wall.

FIG. 8B is an isometric view of an embodiment of the transition flange.

FIG. 12 is a diagram of an embodiment of the plasma system of FIG. 11 to illustrate a transport position of the lower electrode during loading of the wafer onto the lower electrode.

FIG. 13 is a diagram of an embodiment of the plasma system of FIG. 11 to illustrate a position of the lower electrode during processing of the wafer.

DETAILED DESCRIPTION

The following embodiments describe systems and methods for providing a high conductance chamber with radio frequency (RF) symmetry. A vertical arrangement of a chuck support column and an RF rod within the chuck support column allows for symmetric conductance, e.g., flow, etc., around a lower electrode. The vertical arrangement of the RF rod also allows for symmetric RF delivery to the lower electrode. Additionally, in some embodiments, one or more pumps are arranged under and around the chuck support column to provide for more efficient and symmetric pumping to achieve the symmetric conductance. In various embodiments, baffles are added to control and achieve the symmetric conductance. It will be apparent that the present embodiments may be practiced without some or all of these specific details. In other instances, well known process operations have not been described in detail in order not to unnecessarily obscure embodiments of the systems and methods.

Figure 1A:
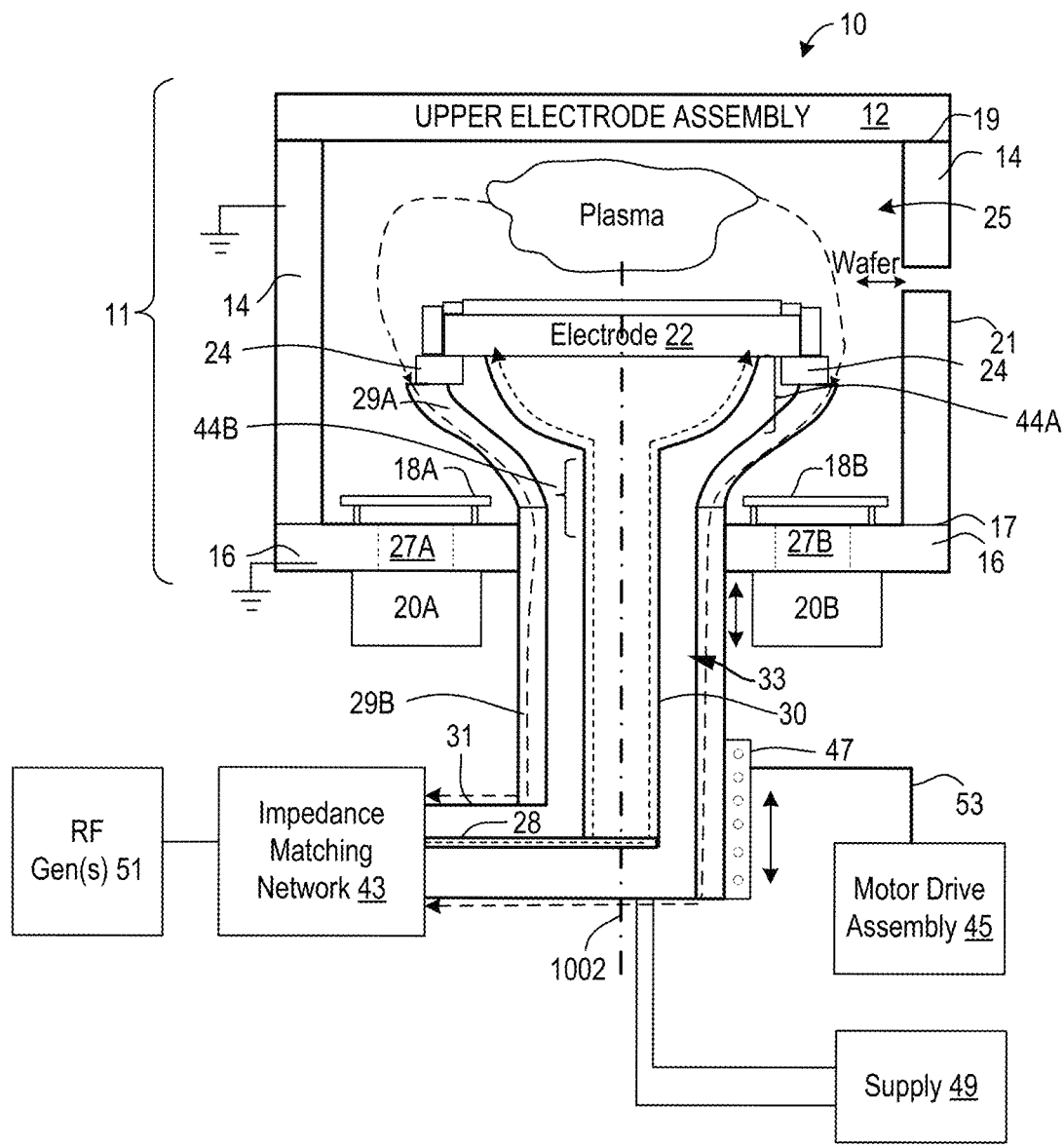
FIG. 1A is a side view of an embodiment of a plasma system.

FIG. 1A is a diagram of an embodiment of a plasma system 10 having a plasma chamber 11. The plasma system 10 includes an upper electrode assembly 12. In some embodiments, the upper electrode assembly 12 is selected to be a capacitively coupled electrode, e.g., a parallel plate, an upper electrode, etc., or an inductively coupled electrode, e.g., one or more coils, etc., for transferring radio frequency (RF) signal to the plasma chamber 11. An advantage of the plasma chamber 11 is that different upper electrode systems, e.g. capacitive, inductive, etc., are coupled at different times to a side wall 14 of the plasma chamber 11. The side wall 14 surrounds an enclosure 25, which is a volume enclosed by the side wall 14. The plasma chamber 11 further includes a transition flange 16, a baffle 18A, and a baffle 18B. Located below each corresponding baffle 18A and 18B, is a pump 20A and a pump 20B. The plasma chamber 11 also includes a lower electrode 22, a dielectric 24, and a radio frequency (RF) rod 30. Included within the plasma system 10 is a bowl-shaped structure 29A, a chuck support column 29B, an RF rod 28, an RF sheath 31 surrounding the RF rod 28, an impedance matching network 43, one or more RF generators 51, a motor drive assembly 45, a linear rail 47, and a supply 49. In some embodiments, a combination of the motor drive assembly 45 and the linear rail 47 is referred to herein as a linear drive assembly.

The RF rod 30 extends via a hollow space 33 formed within the chuck support column 29B. The hollow space 33 is surrounded by an inner surface of the chuck support column 29B. The RF sheath 31 and the RF rod 28 together form an RF transmission line. The RF rod 28 is separated from the RF sheath 31 via an insulator. The RF rods 28 and 30 are made of a conductive material to transfer a modified RF signal. The insulator between the RF sheath 31 and the RF rod 28 insulates an RF signal transferred via the RF rod 28 from an RF signal transferred via the RF sheath 31. In some embodiments, the RF rod 28 is connected to the RF rod 30 via an electrical connection, and the RF rod 30 is connected to the lower electrode 22 via an electrical connection. In some embodiments, an electrical connection point includes a conductive joining surface, a conductive clamp, a conductive glue, an RF strap, a tape, or another connector.

The bowl-shaped structure 29A is fitted to the chuck support column 29B via a coupling mechanism, e.g., bolts, screws, nuts, etc. The chuck support column 29B is fitted, e.g., bolted, attached, etc., to the bowl-shaped structure 29A to support the bowl-shaped structure 29A. The bowl-shaped structure 29A is attached to the dielectric 24, which supports the lower electrode 22. Moreover, the lower electrode 22 is supported by the RF rod 30. Also, in various embodiments, the lower electrode 22 is symmetrically placed with respect to a center axis 1002. For example, the lower electrode 22 is coaxial and concentric with respect to the center axis 1002. The dielectric 24 is made of an insulator material, e.g., ceramic, etc.

In some embodiments, the bowl-shaped structure 29A is fitted within the plasma chamber 11 after being transported via a top opening of the plasma chamber 11. The top opening is formed when the upper electrode assembly 12 is not placed on top of the side wall 14 to be fitted, e.g., bolted, attached, etc., to the side wall 14. Moreover, a portion of the chuck support column 29B is received within the plasma chamber 11 from a bottom opening formed within the transition flange 16. The transition flange 16 is attached, e.g., fitted to, bolted to, etc., a bottom surface 17 of the side wall 14 and the upper electrode assembly 12 is attached to a top surface 19 of the side wall 14. The top surface 19 is located on an opposite end of the side wall 14 compared to the bottom surface 17.

Examples of the one or more RF generators 51 include an x megahertz (MHz) RF generator, a y MHz RF generator, and a z MHz RF generator. The x MHz RF generator is a 400 kilohertz (kHz) RF generator or a 2 MHz RF generator. The y MHz RF generator is a 27 MHz RF generator and the z MHz RF generator is a 60 MHz RF generator. The impedance matching network 43 includes one or more resistors, one or more capacitors, and one or more inductors. In some embodiments, the impedance matching network 43 includes one or more capacitors and one or more inductors.

A portion 44A of the RF rod 30 has a shape that is similar to a shape of the bowl-shaped structure 29A. For example, the portion 44A is also bowl-shaped. The similarity in shapes between the portion 44A and the bowl-shaped structure 29A allows reduction in mismatch between impedances of an RF supply path and an RF return path, both of which are described below. Moreover, a hollow space within the RF rod 30 has an increased diameter at the portion 44A compared to a portion 44B of the RF rod 30, and the increase in diameter allows for various supply lines, e.g., gas supply lines for heating and cooling the lower electrode 22, thermocouple lines for measuring a temperature of the lower electrode 22, alternating current (AC) supply lines for providing AC power to heat the lower electrode 22, etc., to be packaged inside the hollow space.

The lower electrode 22 is made of a metal, e.g., anodized aluminum, alloy of aluminum, etc. Also, the upper electrode is made of a metal, e.g., aluminum, alloy of aluminum, etc. The upper electrode is located opposite to and facing the lower electrode 22. The supply 49 includes one or more storage containers for storing one or more fluids for cooling the lower electrode 22, one or more fluids for heating the lower electrode 22, etc.

The motor drive assembly 45 includes a driver, e.g., one or more transistors, etc., and a motor. The driver is provided a signal from a processor of a host computer system, which is further described below. As used herein, a processor is an application specific integrated circuit (ASIC), or a programmable logic device (PLD), or a microprocessor, or a controller. Upon receiving the signal, the driver generates a current signal to provide to a stator of the motor. A rotor of the motor rotates when the stator receives the current signal. A connection mechanism 53, e.g., one or more rods, one or more rods connected to each other via a gear mechanism, etc., is connected to the rotor and moves with the rotation of the rotor. The movement of the connection mechanism 53 moves the linear rail 47 in a vertical direction with respect to a stationary support, further described below. The movement of the linear rail 47 in the vertical direction moves the bowl-shaped structure 29A, the chuck support column 29B, the RF rod 30, and the lower electrode 22 in the vertical direction with respect to the upper electrode assembly 12 to change a gap between the lower electrode 22 and the upper electrode assembly 12. A wafer is placed in the gap for processing, e.g., etching, depositing materials on, cleaning, sputtering, etc.

The one or more RF generators 51 generate corresponding one or more RF signals, which are modified by the impedance matching network 43 to generate the modified RF signal. For example, the impedance matching network 43 matches an impedance of a load, e.g., the RF transmission line, the plasma chamber 11, etc., connected to an output of the impedance matching network 43 with that of a source, e.g., the one or more RF generators 51, corresponding one or more RF cables connecting the one or more RF generators 51 to the impedance matching network 43, etc., connected to an input of the impedance matching network 43. The modified signal is sent via the RF rod 28 of the RF transmission line to the RF rod 30, and is sent further from the RF rod 30 to the lower electrode 22.

The RF rod 28, the RF rod 30, and the lower electrode 22 form the RF supply path for supplying the modified RF signal to the lower electrode 22. The RF rod 30, which is not bent and is vertical throughout its length provides for symmetric delivery of the modified RF signal to the lower electrode 22. It should be noted that the portion 44B of the RF rod 30 within the plasma chamber 11 has a vertical, e.g., not horizontal, not bent, etc., orientation. The vertical orientation of the portion 44B of the RF rod 30 facilitates an unobstructed delivery of RF power of the modified RF signal to the lower electrode 22. The delivery of the modified RF signal is symmetric with respect to the central axis 1002, which, in some embodiments, is a center axis of the RF rod 30. For example, the center axis 1002 passes through a centroid of the RF rod 30. As another example, the RF rod 30 is coaxial with respect to the center axis 1002.

Moreover, conductance, which is a flow of remnant materials, e.g., etch byproducts, reactant gases, deposition byproducts, cleaning byproducts, etc., and/or plasma in the plasma chamber 11, is symmetric around the lower electrode 22 when the chuck support column 29B and the bowl-shaped structure 29A are symmetric with respect to the center axis 1002. For example, the chuck support column 29B is coaxial with respect to the center axis 1002 and the bowl-shaped structure 29A is coaxial with respect to the center axis 1002. To further illustrate, the center axis 1002 passes through a centroid of the chuck support column 29B and a centroid of the bowl-shaped structure 29A.

In some embodiments, the chuck support column 29B does not impede conductance of the remnant materials and/or plasma from the lower electrode 22 to the vacuum pumps 20A and 20B. For example, a cantilevered stem support that is bent within the plasma chamber 11 and is fitted via the side wall 14, e.g., an outside side surface 21 of the side wall 14, etc., hinders conductance of the remnant materials to the vacuum pumps 20A and 20B. The side surface 21 forms an angle, e.g., 90 degrees, between 85 degrees and 95 degrees, etc., with respect to the top surface 19 and the bottom surface 17. Comparatively, the chuck support column 29B that is vertical, is not bent within the plasma chamber 11, and is not fitted within the plasma chamber 11 via the side wall 14 does not hinder conductance of remnant materials and/or plasma to the vacuum pumps 20A and 20B.

In various embodiments, the vacuum pumps 20A and 20B are arranged symmetric with respect to the center axis 1002. For example, the vacuum pump 20A is located at the same distance from the center axis 1002 as that of the vacuum pump 20B from the center axis 1002. As another example, the vacuum pumps 20A and 20B are located concentric to the center axis 1002 so that the center axis 1002 passes through a centroid of a volume that encompasses the vacuum pumps 20A and 20B. In some embodiments, the vacuum pump 20A is located at a distance from the center axis 1002 and the distance is within a pre-determined threshold of a distance of the vacuum pump 20B from the center axis 1002. The symmetric arrangement of the vacuum pumps 20A and 20B facilitates achieving conductance of the remnant materials and/or the plasma that is symmetric with respect to the center axis 1002.

In various embodiments, the baffle 18A opens or closes an opening 27A to control an amount of flow of plasma and/or the remnant materials from the plasma chamber 11 to the vacuum pump 20A. For example, an amount of flow from the plasma chamber 11 to outside the plasma chamber 11 increases when the baffle 18A is open and decreases when the baffle 18A is closed. Similarly, the baffle 18B opens or closes an opening 27B to control an amount of flow of plasma and/or the remnant materials from within the plasma chamber 11 to outside the plasma chamber 11. The openings 27A and 27B are formed in the transition flange 16 and are between the plasma chamber 11 and the vacuum pumps 20A and 20B. In some embodiments, the baffles 18A and 18B are located symmetric with respect to the center axis 1002. For example, the baffles 18A and 18B are located equidistant from the center axis 1002. The baffles 18A and 18B are controlled to achieve symmetric conductance.

In some embodiments, the openings 27A and 27B symmetrical with respect to the center axis 1002 (FIG. 1A).

For example, both the openings 27A and 27B are located equidistant from the center axis 1002. In various embodiments, in which more than two openings are used to accommodate flow to multiple pumps, all the openings are symmetrical with respect to the center axis 1002. For example, all the openings are located equidistant from the center axis 1002. The opening 27A is formed between the vacuum pump 20A (FIG. 1A) and the enclosure 25 (FIG. 1A) of the plasma chamber 11 and the opening 27B is formed between the vacuum pump 20B (FIG. 1A) and the enclosure 25 of the plasma chamber 11.

The RF return path is formed by an RF return signal from the plasma formed within the plasma chamber 11. The RF return signal returned from the plasma traverses via the dielectric 24, the bowl-shaped structure 29A, the chuck support column 29B, and the RF sheath 31 of the RF transmission line to the impedance matching network 43.

In some embodiments, any other number, e.g., three, four, etc., of vacuum pumps are used instead of the vacuum pumps 20A and 20B, and all the vacuum pumps are placed symmetric with respect to the center axis 1002. For example, when three pumps are used, the pumps are located at a corresponding vertex of an imaginary horizontal triangle that is perpendicular to the center axis 1002 and the center axis 1002 passes through a center of the horizontal triangle. The symmetric arrangement of the vacuum pumps allow for symmetric conductance of the remnant materials and/or plasma from within the plasma chamber 11 to the vacuum pumps.

In some embodiments, instead of the bowl-shaped structure 29A, a structure of any other shape, e.g., polygonal, square, etc., is used.

In various embodiments, the enclosure 25 is surrounded by the side wall 14, the upper electrode assembly 12, and the transition flange 16. For example, the enclosure 25 has a volume that is enclosed by the side wall 14, the upper electrode assembly 12, and the transition flange 16.

In various embodiments, a portion of the chuck support column 29B is not angled with respect to another portion of the chuck support column 29B. For example, the chuck support column 29B is not bent but is straight.

In several embodiments, the RF rod 30 is not angled with respect to another portion of the RF rod 30. For example, the RF rod 30 is not bent but is straight.

In various embodiments, the transition flange 16 is a part of the plasma chamber 11. For example, the transition flange 16 forms a bottom wall of the plasma chamber 11.

In various embodiments, the center axis 1002 is equidistant from side wall 14 of the plasma chamber 11. In some embodiments, the center axis 1002 is equidistant from the RF rod 30 or from the chuck support column 29B. In several embodiments, the center axis 1002 is equidistant from an edge of the lower electrode 22 (FIG. 1A).

In some embodiments, conductance within the plasma chamber 11 changes to change pressure within the plasma chamber 11. For example, pressure within a region of the plasma chamber 11 increases when conductance within the region increases. As another example, pressure within a region of the plasma chamber 11 decreases when conductance within the region decreases. As yet another example, pressure within a region of the plasma chamber 11 is uniform when conductance within the region is uniform. As another example, pressure within a region of the plasma chamber 11 is non-uniform when conductance within the region is non-uniform.

Figure 1B:
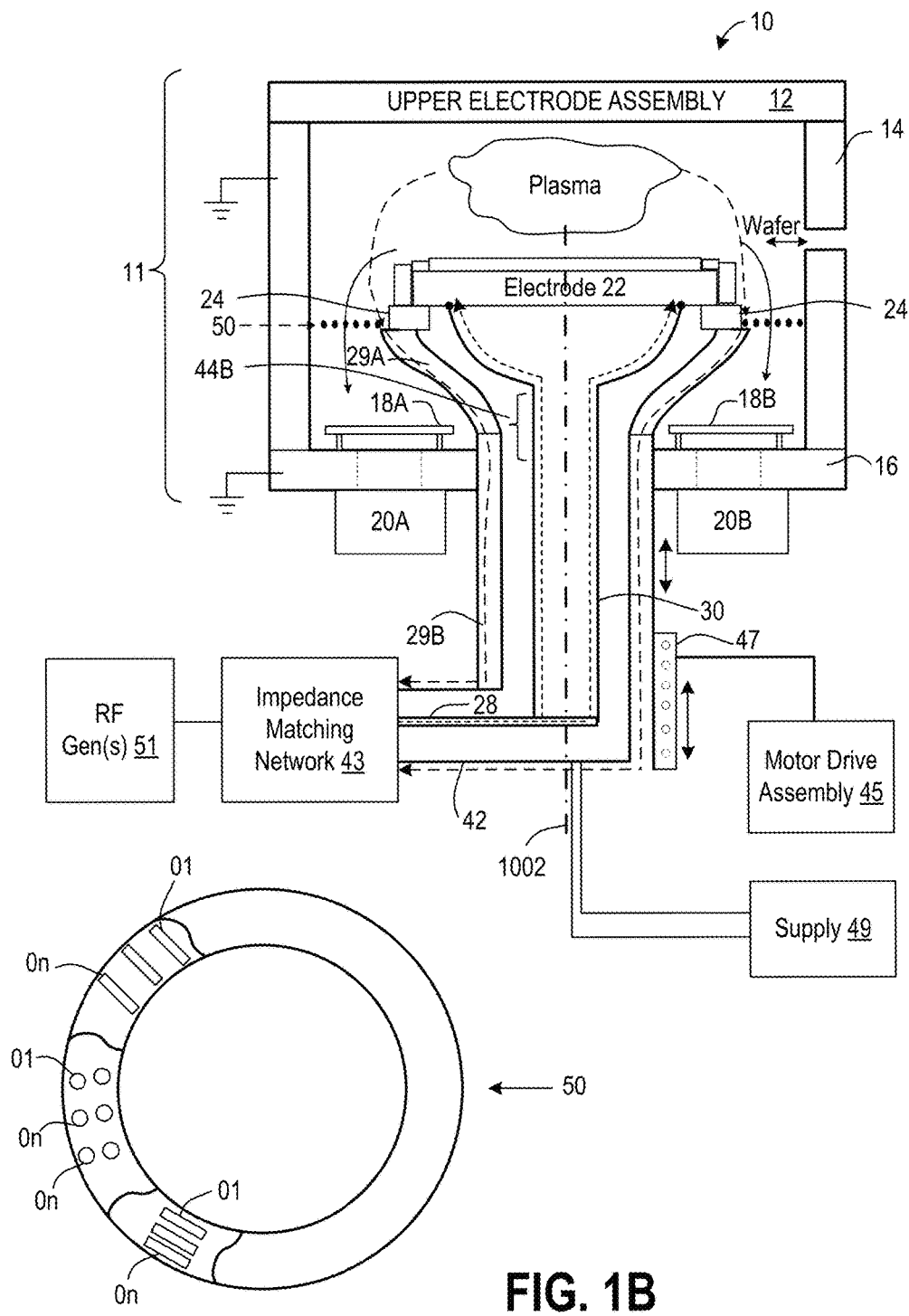
FIG. 1B is a diagram to illustrate a grid placed between a lower electrode and an inner diameter of a plasma chamber.

FIG. 1B is a diagram to illustrate a grid 50 optionally placed between the electrode 22 and the bowl-shaped structure 29A and fitted between the side wall 14 and the dielectric 24. For example, the grid 50 is fitted to the side wall 14 using the coupling mechanism and is connected to the dielectric 24 using the coupling mechanism. The grid 50 is made of silicon, or a conductive material, etc. The grid 50 is used to control, e.g., increase, decrease, etc., conductance of the plasma and/or the remnant materials from a region 1 to a region 2 within the plasma chamber 11. The regions 1 and 2 are further described below. In some embodiments, the grid 50 is circular and has various openings O1 thru On, where n is an integer greater than zero. As an example, each opening is elongated or circular or of any other shape. Various shapes of openings of the grid 50 are illustrated in FIG. 1B. Although various shapes are illustrated, the grid 50 has openings of the same shape. In some embodiments, the grid 50 has two different shapes of openings.

The grid 50 is also used to channel the RF return signal from the plasma to the chuck support column 29B. For example, the grid 50 transfers the RF return signal from the plasma to the chuck support column 29B to form the RF return path.

Figure 1C:
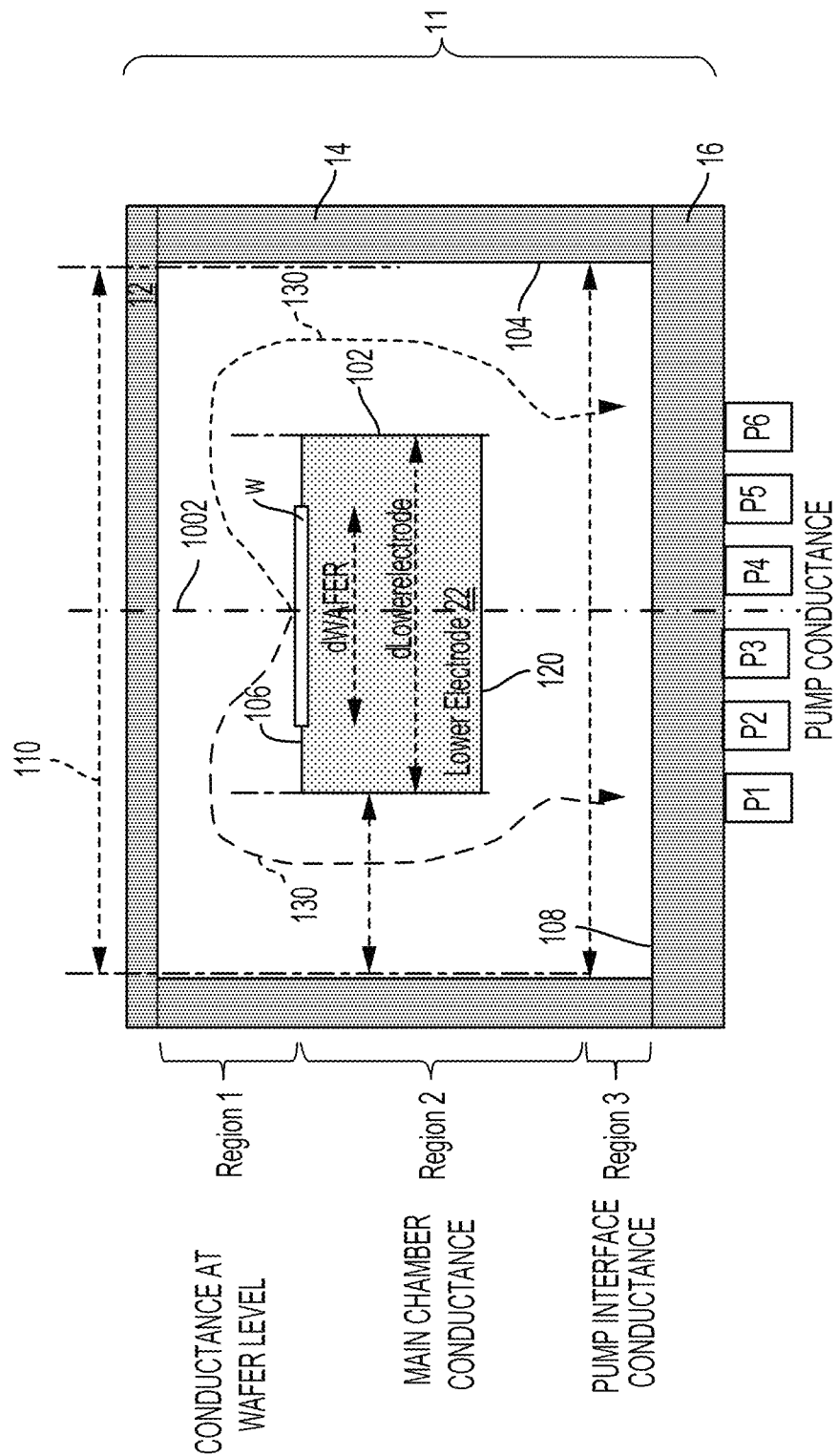
FIG. 1C is a side view of an embodiment of a plasma chamber to illustrate different conductance regions within the plasma chamber and various parameters that affect the conductance.

FIG. 1C is a diagram of an embodiment of the plasma chamber 11 to illustrate different conductance regions 1, 2, and 3 within the plasma chamber 11 and various parameters that affect conductance of the plasma and/or the remnant materials. The plasma chamber 11 is used to process wafers of different sizes, e.g., 450 millimeter (mm) diameter wafer, wafer having a diameter greater than 450 mm, wafer having a diameter between 300 mm and 450 mm, wafer having a diameter between 300 mm and 500 mm, wafer having a diameter between 300 and 600 mm, etc. A wafer placed within the plasma chamber 11 is designated as W. The plasma chamber 11 has the region 1 in which conductance is measured at a wafer level, e.g., level at which a wafer is placed on the lower electrode 22, a level above a top surface 106 of the lower electrode 22, etc. The region 1 extends between the top surface 106 and the upper electrode assembly 12. Conductance of the plasma and/or the remnant materials is uniform within the region 1. Moreover, the plasma chamber 11 has the region 2 that is surrounded by a side wall 102 of the lower electrode 22, an inner surface 104 of the side wall 14 of the plasma chamber 11, a plane passing via the top surface 106 of the lower electrode 22, and a pre-determined plane, which is at a pre-determined distance from an inner bottom surface 108 of the transition flange 16. The transition flange 16 provides an interface to one or more pumps P1 thru P6, e.g., turbo molecular pumps (TMPs), turbo pumps, vacuum pumps, etc. Conductance drops within the region 2 compared to the region 1. The plasma chamber 11 has the region 3 at the inner bottom surface 108 of the transition flange 16, e.g., within the pre-determined distance above the inner bottom surface 108 of the transition flange 16, etc. Conductance of the plasma and/or the remnant materials is uniform within the region 3.

A conductance path 130 of conductance of the plasma and/or the remnant materials has a direction of conductance from the region 1 via the region 2 to the region 3. The conductance path 130 provides a direction of flow of the plasma and/or the remnant materials from the plasma chamber 11 to the pumps P1 thru P6 after a plasma process when the pumps P1 thru P6 are operated to create a partial vacuum within the plasma chamber 11.

In some embodiments, a volume of the region 1 is determined by designs of liners attached to the inner surface 104, a volume of the region 2 is determined by a diameter 110 of the inner surface 104 of the side wall 14 and a height of the lower electrode 22 and a diameter dLowerelectrode of the lower electrode 22, and a volume of the region 3 is determined by one or more types and a number of the one or more pumps and a layout, e.g., arrangement, etc., of the one or more pumps with respect to the center axis 1002. The liners are attached to, e.g., fitted to, bolted to, etc., the side wall 14 of the plasma chamber 11. In some embodiments, a liner is made of a metal or a semiconductor material. In various embodiments, a liner is provided inside the plasma chamber 11 to protect the chamber walls from etch or process particles, and the linear is cleaned and replaced when needed.

Examples of the diameter 110 include a diameter ranging between 32 inches and 40 inches. As an illustration, the diameter 110 is 35 inches. As another illustration, the diameter 110 is 36 inches. The diameter 110 of the region 1 is greater than that of a plasma chamber used to process 300 mm wafers. It should be noted that in some embodiments in which the liners are fitted to the inner surface 104, the diameter 110 is a diameter from a surface of one of the liners attached to the inner surface 104 to a surface of another one of the liners attached to the inner surface 104 on an opposite side of the side wall 14. For example, a diameter of the region 1 is a length of a line that is perpendicular to the liners attached to the inner surface 104 of the plasma chamber 11. In various embodiments in which the liners are not used, the diameter 110 is a diameter of the inner surface 104 of the side wall 14.

In some embodiments, the region 2 is a space that extends from the plasma passing via the top surface 106 to a bottom surface 120 of the lower electrode 22 and extends between the lower electrode 22 and the side wall 14. In various embodiments, the region 3 is located between the bottom surface 120 and the inner bottom surface 108 of the transition flange 16.

In various embodiments, in the region 1, there is conductance above a top surface of the wafer W and in the region 3, there is conductance above the pumps P1 through P6.

In some embodiments, a shield or a grid, such as the grid 50, etc., is fitted within the plasma chamber 11 to separate the region 2 from the region 3. For example, the shield or grid is fitted to the inner surface 104 of the side wall 14 under the lower electrode 22.

Figure 2B:
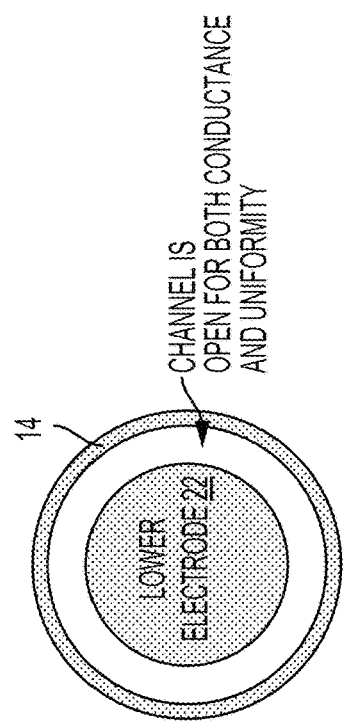
FIG. 2B is a top view of an embodiment of the plasma chamber to illustrate conductance in a region within the plasma chamber.
Figure 2A:
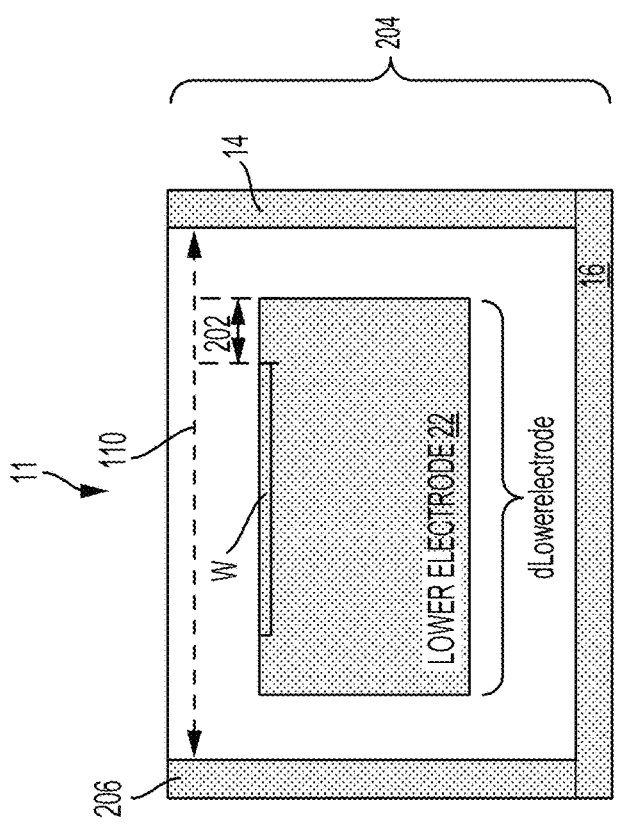
FIG. 2A is a diagram to illustrate how a diameter of the plasma chamber, an outer diameter of a cathode, and a height of the plasma chamber are changed to increase conductance within the plasma chamber.

FIG. 2A is a block diagram of the plasma chamber 11 to illustrate how the diameter 110, which is an inner diameter, of the plasma chamber 11, the diameter dLowereelectrode, which is an outer diameter, of the lower electrode 22, and a height 204 of the plasma chamber 11 are changed to increase conductance within the plasma chamber 11. In some embodiments, the height 204 excludes a height of the upper electrode assembly 12 (FIG. 1A) and includes a height of the side wall 14 and a height of the transition flange 16. The diameter 110 of the plasma chamber 11, the diameter dLowereelectrode, and the height 204 of the plasma chamber 11 are examples of parameters that affect conductance within the plasma chamber 11. Conductance is increased by maximizing the diameter dLowereelectrode of the lower electrode 22, minimizing the diameter 110 of the plasma chamber 11, and minimizing the height of the plasma chamber 11.

In some embodiments, the plasma chamber 11 achieves conductance of at least 2.25 times than that achieved using a plasma chamber for processing the 300 mm wafer. For example, the diameter 110 of the plasma chamber 11 ranges between 0.75 meters to 1 meter and the height of the side wall 14 of the plasma chamber 11 ranges between 0.4 meters and 0.7 meters. Moreover, in the example, the height of the transition flange 16 ranges between 0.2 meters to 0.4 meters.

Further, in this example, a distance 202 between the wafer W and an edge of the lower electrode 22 ranges between 14 inches and 30 inches.

FIG. 2B is a top view of an embodiment of the plasma chamber 11. A rate, e.g., speed, etc., of conductance of the remnant materials and/or the plasma increases from the region 1 to the region 3 (FIG. 1C) when a channel formed between the side wall 14 and the lower electrode 22 is narrow. The channel becomes narrower as a width, e.g., the diameter dLowereelectrode, etc., of the lower electrode 22 is increased and a width, e.g., the diameter 110, etc., of the plasma chamber 11 decreases. The width of the lower electrode 22 is increased to facilitate placement of the 450 mm wafer compared to the 300 mm wafer on the lower electrode 22. Also, as the height 204 (FIG. 2A) becomes shorter, a distance to be traversed by the remnant materials and/or the plasma is reduced to increase the rate of conductance.

Figure 3C:
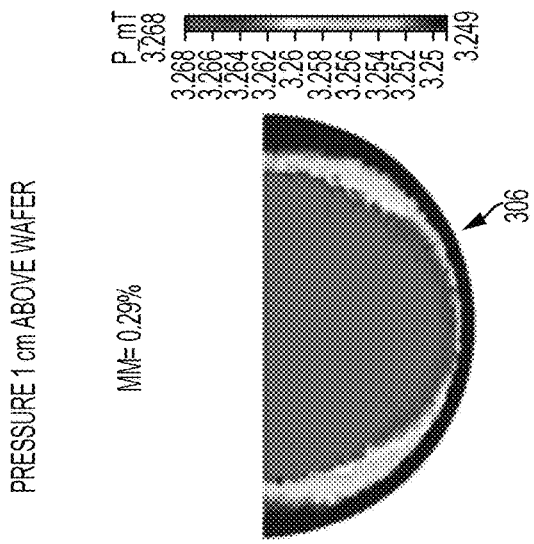
FIG. 3C is an embodiment of a pressure map to illustrate uniformity in pressure at a pre-determined distance above the wafer.
Figure 3B:
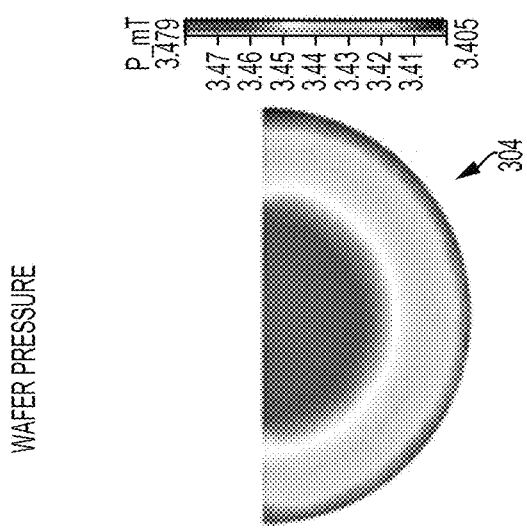
FIG. 3B is an embodiment of a pressure map to illustrate uniformity in pressure at a top surface of a wafer W placed within the plasma chamber.
Figure 3A:
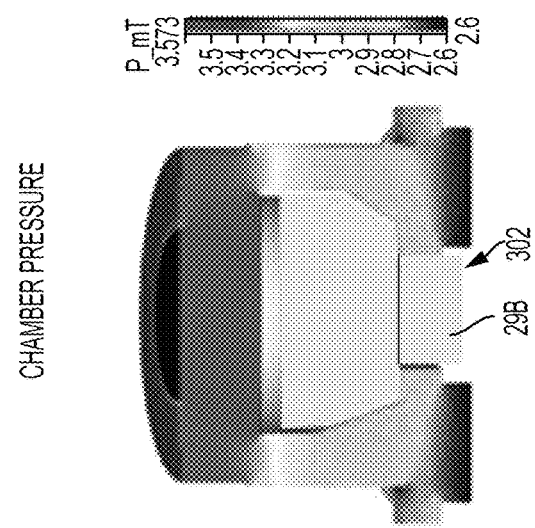
FIG. 3A is a diagram to illustrate a vertical mount of a chuck support column into the plasma chamber.

FIG. 3A is a diagram to illustrate a manner in which the chuck support column 29B is inserted in the plasma chamber 11. The chuck support column 29B is inserted into the enclosure 25 (FIG. 1A) of the plasma chamber 11 via an opening 302 formed within the transition flange 16. In some embodiments, the opening 302 for mounting the chuck support column 29B is located at a center of the inner bottom surface 108 (FIG. 1C) of the transition flange 16 (FIG. 1C). For example, the opening 302 is not formed within the side wall 14 of the plasma chamber 11. As another example, no portion of the opening 302 is created within the side wall 14.

In various embodiments, an angle is not formed inside the plasma chamber 11 between a portion of the chuck support column 29B that couples to the bowl-shaped structure 29A (FIG. 1A) and another portion of the chuck support column 29B within the plasma chamber 11. Moreover, uniformity in conductance at the inner bottom surface 108 of the transition flange 16, which provides an interface to the one or more pumps, is achieved when the chuck support column 29B within the plasma chamber 11 is vertical to not interfere with removal of the plasma and/or the remnant materials.

FIG. 3B is an embodiment of a pressure map 304 to illustrate uniformity in pressure at the top surface of the wafer W. By mounting the chuck support column 29B from a bottom of the plasma chamber 11 via the transition flange 16, uniformity in pressure at the wafer W is achieved and uniformity in pressure at a pre-determined distance, e.g., 1 centimeter, etc., above the wafer W is achieved.

FIG. 3C is an embodiment of a pressure map 306 to illustrate uniformity in pressure at the pre-determined distance above the wafer W. As illustrated in the pressure map 306, minimum and maximum pressure variation at the pre-determined distance above the wafer W is 0.29%.

Figure 4:
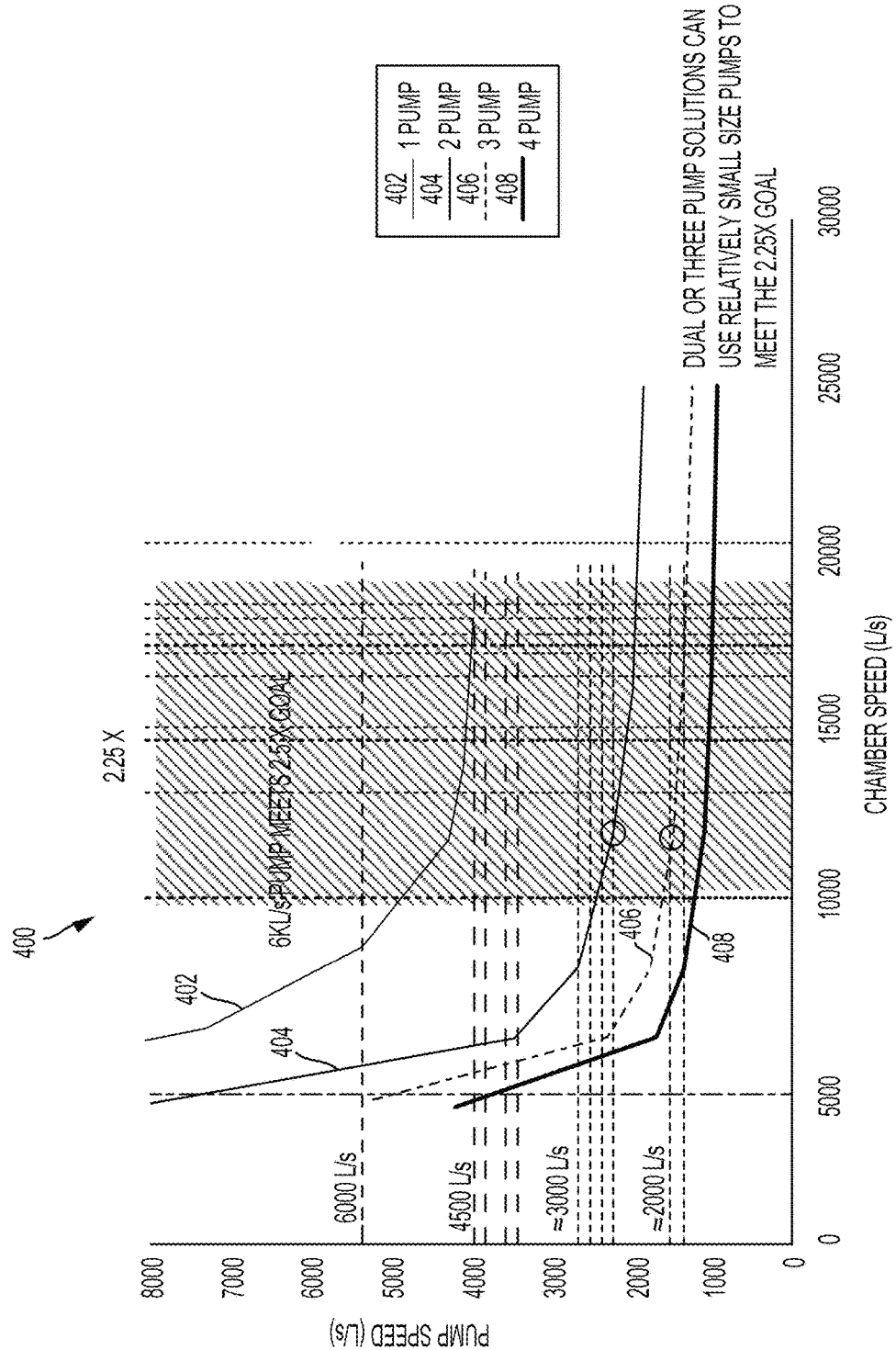
FIG. 4 is a graph to illustrate that one or more pumps are used to remove plasma and/or remnants of a plasma process from the plasma chamber.

FIG. 4 is a graph 400 to illustrate that the one or more pumps are used to remove the plasma and/or the remnants of a plasma process from the plasma chamber 11. The graph 400 plots pump speed in liters/second (L/s) versus chamber speed in liters/second. The chamber speed is conductance at the wafer W. As shown in the graph 400, either a single pump that is a 6 kiloliter/second (kL/s) speed pump is used or two pumps that are each a 4.5 kL/s speed pump or two pumps that are each a 3 kL/s speed pump or three pumps that are each a 2 kL/s speed pump, are used to remove the plasma and/or the remnants. Instead of one large 6 kL/s pump, multiple small pumps are used as is illustrated using FIG. 4. By using the one or more pumps as illustrated in FIG. 4, a goal of achieving conductance that is at least 2.25 times greater is achieved.

A speed by which the reactant gases are provided to the plasma chamber 11 to generate plasma or maintain plasma within the plasma chamber 11 increases at least by 2.25 times when the plasma chamber 11 is used to process the 450 mm wafer. The speed increases compared to a speed with which the reactant gases are provided to a plasma chamber for processing the 300 mm wafer. Also, to match the increase in speed, a speed of pumping the remnant materials and/or the plasma from the plasma chamber 11 to outside the plasma chamber 11 is increased by at least 2.25 times compared to pumps used to remove the remnant materials and/or the plasma from a plasma chamber used to process the 300 mm wafer.

FIG. 5A is a top view 500 of an embodiment of the plasma system 10 to illustrate use of the chuck support column 29B without a baffle. In the top view 500 of the plasma system 10, the chuck support column 29B, the openings 27A and 27B, the lower electrode 22, and the side wall 14 of the plasma chamber 11 are shown. A baffle, e.g., a plate, a metal plate, etc. is not used in an embodiment of the plasma chamber 11 illustrated using the top view 500.

FIG. 5B is an embodiment of a pressure plot 524A at the top surface of the wafer W when a baffle is not used in the plasma system 10 (FIG. 1A). Moreover, FIG. 5C is an embodiment of another pressure plot 524B at the pre-determined distance from the top surface of the wafer W when a baffle is not used in the plasma system 10 (FIG. 1A). The pressure plots 524A and 524B are further explained below.

FIG. 5D is another top view 510 of an embodiment of the plasma system 10 in which the baffles 18A and 18B are used. For example, the baffles 18A and 18B are placed within the region 3, e.g., adjacent to the inner bottom surface 108 (FIG. 1C) of the transition flange 16 (FIG. 1C). The baffle 18A is moved in the vertical direction to cover or open the opening 27A and the baffle 18B is moved in the vertical direction to cover or open the opening 27B. The baffles 18A and 18B are operated, e.g., moved up or down, etc., to control opening and closing of the openings 27A and 27B to further control pressure within the plasma chamber 11. For example, each baffle, as described herein, is controlled via a motor drive assembly and a connection mechanism to control a vertical movement of the baffle. Further description of how a baffle is controlled is provided below. A baffle is moved up or down to control opening and closing of the openings 27A and 27B to further control conductance within the plasma chamber 11 and to achieve symmetry of conductance within the region 3 of the plasma chamber 11. For example, conductance is increased when the baffles 18A and 18B are moved up in the vertical direction to open the openings 27A and 27B and decreased when the baffles 18A and 18B are moved down in the vertical direction to close the openings 27A and 27B. In some embodiments, a baffle acts as a valve to prevent air and/or other materials from flowing into the plasma chamber 11 from outside the plasma chamber 11.

The baffles 18A and 18B are polygonal, e.g., rectangular, square, etc., in shape and are located above the respective pumps 20A and 20B. In some embodiments, the baffles 18A and 18B are of another shape, e.g., circular, oval, etc.

FIG. 5E is an embodiment of a pressure plot 526A at the top surface of the wafer W when the baffles 18A and 18B are used in the plasma system 10 (FIG. 1A). Moreover, FIG. 5F is an embodiment of another pressure plot 526B at the pre-determined distance from the top surface of the wafer W when the baffles 18A and 18B are used in the plasma system 10 (FIG. 1A). The pressure plots 526A and 526B are further explained below.

FIG. 5G is yet another top view 520 of the plasma system 10 in which a baffle 522A and a baffle 522B are used. Each baffle 522A and 522B is crescent-shaped and is located at an outer edge of the inner bottom surface 108 of the transition flange 16. For example, the baffles 522A and 522B are located adjacent to the inner bottom surface 108 of the transition flange 16 and adjacent to the inner surface 104 (FIG. 1C) of the side wall 14 to control a portion of the openings 27A and 27B between the transition flange 16 and the pumps 27A and 27B. The baffles 522A and 522B are controlled via a motor drive assembly, examples of which are provided herein, and a connection mechanism, examples of which are provided herein, to control conductance within the plasma chamber 11. The use of baffles 18A, 18B (FIG. 5D), 522A, and 522B facilitates achievement of an increased degree of flow symmetry at high conductance to achieve pressure control within the plasma chamber 11.

In various embodiments, all the baffles 18A, 18B, 522A, and 522B are used within the plasma chamber 11. For example, all the baffles 18A, 18B, 522A, and 522B are placed adjacent to the inner bottom surface 108 of the transition flange 16.

FIG. 5H is an embodiment of a pressure plot 528A at the top surface of the wafer W when the baffles 522A and 522B are used in the plasma system 10 (FIG. 1A). Moreover, FIG. 5I is an embodiment of another pressure plot 528B at the pre-determined distance from the top surface of the wafer W when the baffles 522A and 522B are used in the plasma system 10 (FIG. 1A).

As seen from the pressure maps 524A, 524B, 526A, and 526B, pressure at the wafer W, e.g., on the top surface of the wafer W, etc., is more uniform, e.g., symmetric, etc., with use of the baffles 18A and 18B than when the baffles 18A and 18B are not used. Moreover, as seen from the pressure maps 526A, 526B, 528A, and 528B, pressure at the pre-determined distance above the wafer W is more uniform with use of the baffles 522A and 522B compared to when the baffles 522A and 522B are not used and compared to when the baffles 18A and 18B are used within the plasma chamber 11.

An increase in uniformity of pressure at the wafer W or at the pre-determined distance above the wafer W provides uniformity in processing of the wafer W. For example, the wafer W is etched more uniformly when the baffles 18A and 18B are used compared to when the baffles 18A and 18B are not used. As another example, the wafer W is etched more uniformly when the baffles 522A and 522B are used compared to when the baffles 522A and 522B are not used.

Figure 5J:
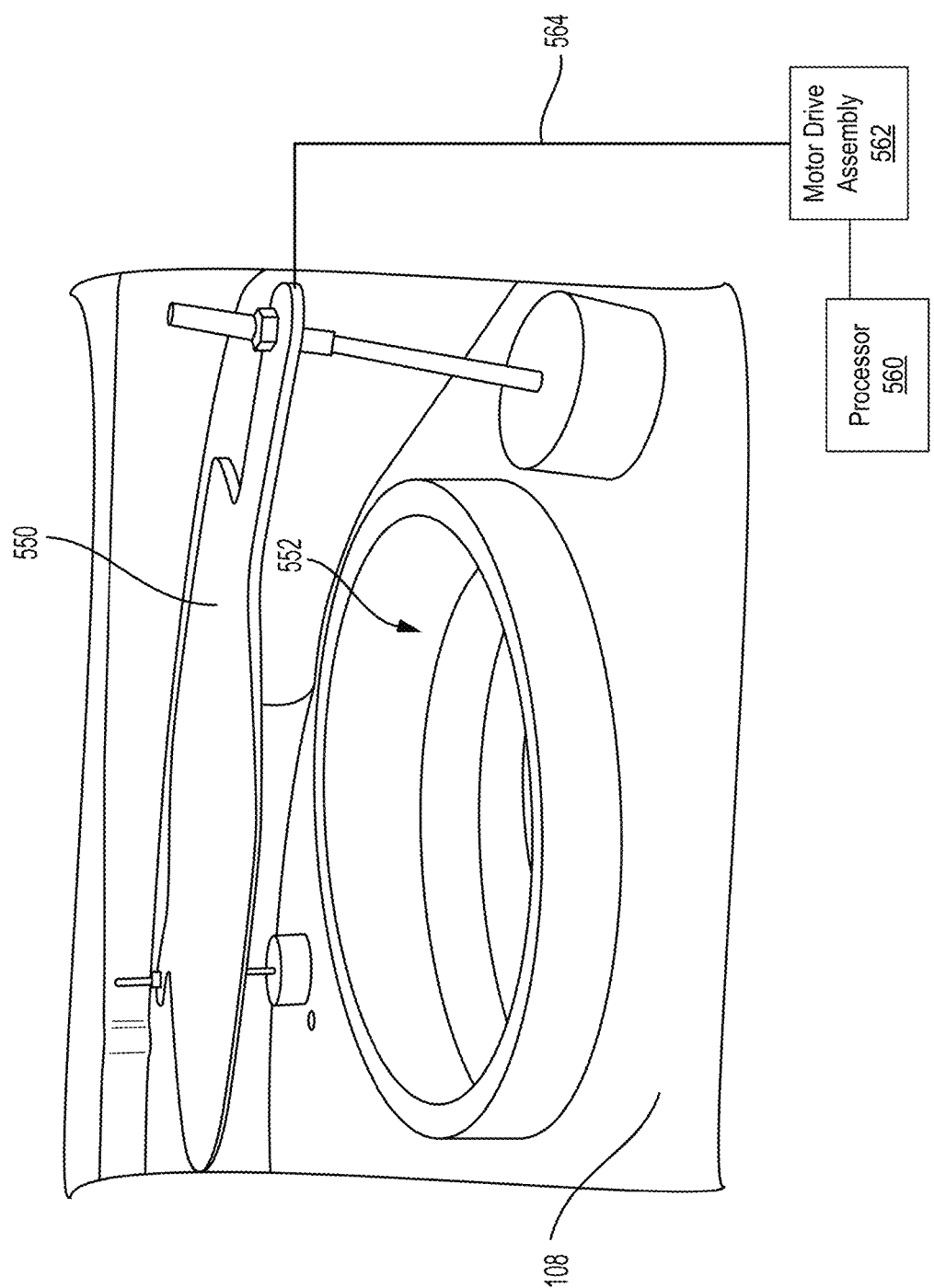
FIG. 5J is an isometric view of a baffle to illustrate control of the baffle by a processor.

FIG. 5J is an isometric view of a baffle 550 to illustrate control of the baffle 550 using a processor 560. The baffle 550 is an example of the baffle 18A or the baffle 18B (FIG. 1A). Similarly, an opening 552 within the inner bottom surface 108 of the transition flange 16 is an example of the opening 27A or the opening 27B (FIG. 5A). The processor 560 is the processor of the host computer system. The processor 560 is connected to a motor drive assembly 562, which is connected via a connection mechanism 564 to the baffle 550. The motor drive assembly 562 has the same structure as that of the motor drive assembly 45 (FIG. 1A). For example, the motor drive assembly 562 includes a driver that is connected to a motor, which is further connected to the connection mechanism 564. As another example, the driver of the motor drive assembly 562 includes one or more transistors and the drive is connector to a stator of the motor of the motor drive assembly 562 and the rotor of the motor is connected to the connection mechanism 564. Examples of the connection mechanism 564 include one or more rods, or one or more rods that are connected to each other via a gear mechanism, or a poppet valve, etc.

The baffle 550 reduces an amount of space taken up under the transition flange 16 by a pendulum valve, which is further described below. For example, the baffle 550 reduces a distance, e.g., a height, etc., of conductance from the top surface of the wafer W to the vacuum pumps 20A and 20B (FIG. 1A) by being located inside the plasma chamber 11 compared to the pendulum valve, which is located outside and below the plasma chamber 11. The reduction in the amount of space increases conductance.

Moreover, the baffle 550 is controlled to move in the vertical direction to control conductance within the plasma chamber 11. For example, the processor 560 sends a signal to the driver of the motor drive assembly 562 and upon receiving the signal, the driver generates a current signal. The current signal is provided to the motor of the motor drive assembly 562 to rotate by a pre-determined amount. The rotation of the motor rotates the connection mechanism 564 to move the baffle 550 in the vertical direction, either away from the opening 552 to open the opening 552 or towards the opening 552 to close the opening 552.

Figure 6:
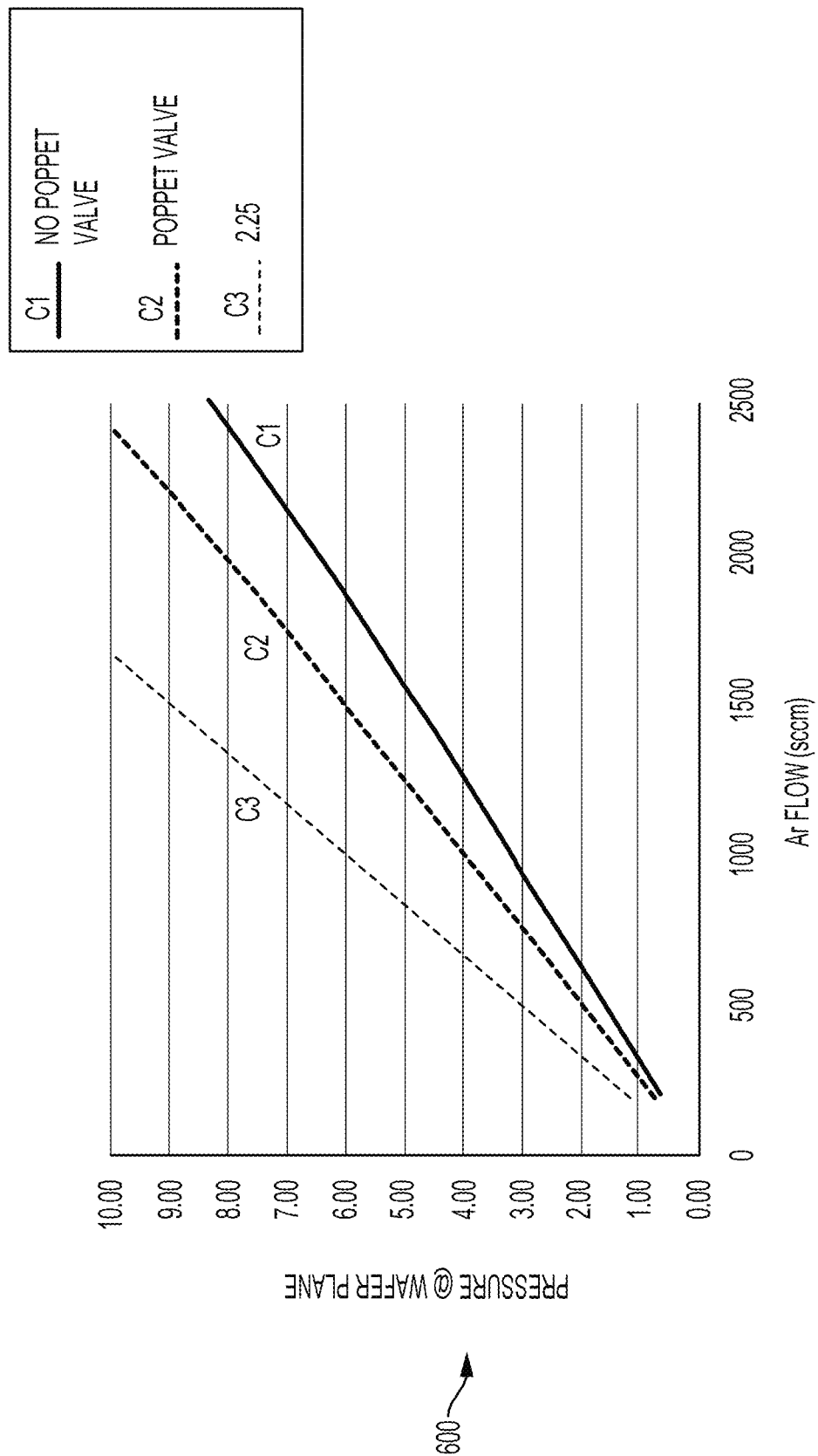
FIG. 6 is an embodiment of a graph to illustrate an amount of control of conductance of a gas from the plasma chamber to outside the plasma chamber with and without use of a poppet valve.

FIG. 6 is an embodiment of a graph 600 to illustrate an amount of control of conductance of a gas, e.g., Argon, etc., from the plasma chamber 11 (FIG. 1A) to outside the plasma chamber 11 with and without use of poppet valves. The graph 600 plots pressure at the top surface of the wafer W versus a flow of the gas via the openings 27A and 27B (FIG. 5A) in the transition flange 16. A plot C1 is plotted when poppet valves are not used to control the baffles 18A and 18B (FIG. 5D) and not used to control the baffles 522A and 522B (FIG. 5G). Moreover, a plot C2 is plotted when the poppet valves are used. A plot C3 is a target plot to illustrate that a conductance of 2.25 times is achieved using the plasma chamber 11. The conductance is 2.25 times compared to that achieved using a plasma chamber for the 300 mm wafer.

As illustrated from the plots C1 and C2, to achieve the same amount of pressure at the plane of the wafer W as that shown in the target plot C3, there is more room to change the conductance of the remnant materials and/or the plasma.

Figure 7C:
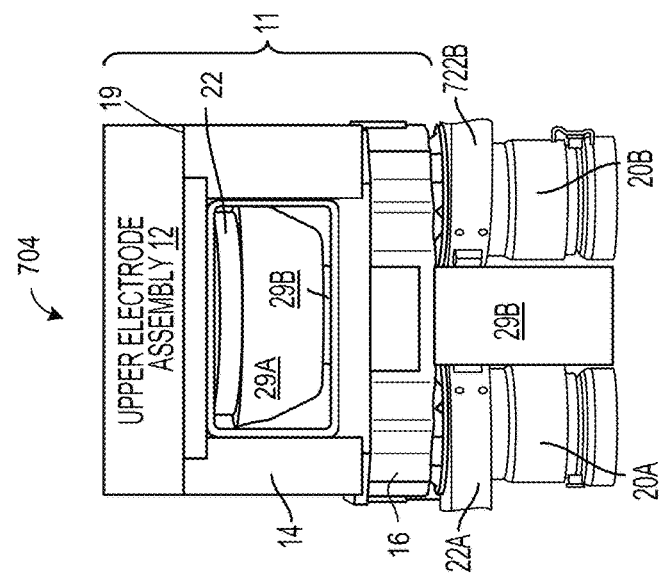
FIG. 7C is a side view of an embodiment of a plasma system to illustrate fitting of an upper electrode system to the side wall.
Figure 7B:
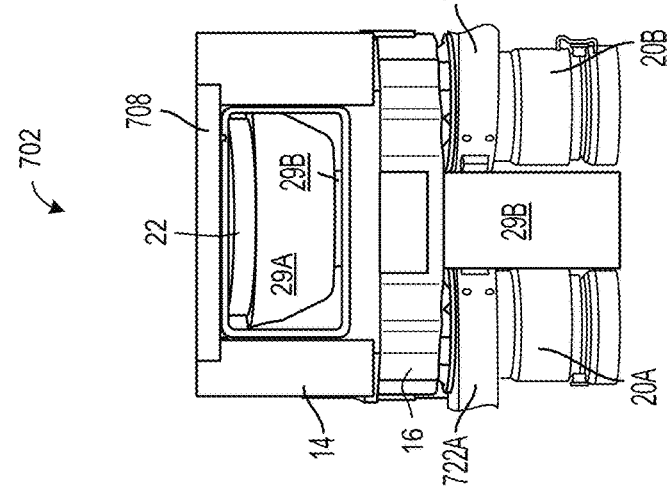
FIG. 7B is a side view of an embodiment of a plasma system to illustrate fitting of the side wall around the chuck support column and fitting of a bowl-shaped structure.
Figure 7A:
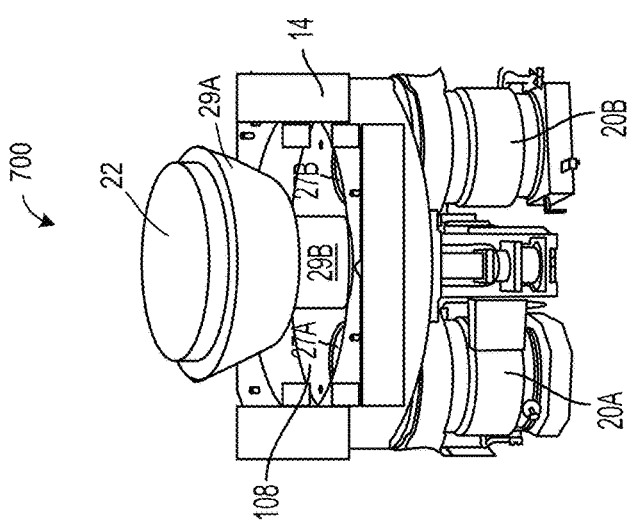
FIG. 7A is an isometric view of an embodiment of a plasma system to illustrate that the chuck support column is inserted via an opening formed within an inner bottom surface of a transition flange to be within an inside volume surrounded by a side wall of the plasma chamber.

FIG. 7A is an isometric view of an embodiment of a plasma system 700 to illustrate that the chuck support column 29B is inserted via the opening 302 (FIG. 3) formed within the inner bottom surface 108 of the transition flange 16 to be within the enclosure 25 (FIG. 1A) surrounded by the side wall 14 (FIG. 1A). This is how the chuck support column 29B is vertically mounted within a plasma chamber 11. The bowl-shaped structure 29A is fitted to the chuck support column 29B from a top of the plasma system 700.

FIG. 7B is a side view of an embodiment of a plasma system 702 to illustrate fitting of the side wall 14 around the chuck support column 29B and fitting of the bowl-shaped structure 29A. The chuck support column 29B is inserted via the opening 302 (FIG. 3) and the bowl-shaped structure 29A is placed on top of the chuck support column 29B to be fitted to the chuck support column 29B. The side wall 14 is then placed around the bowl-shaped structure 29A and is fitted to the transition flange 16.

In some embodiments, the lower electrode 22 and the chuck support column 29B are concentric with respect to each other, with respect to the transition flange 16, and with respect to the side wall 14. The concentric arrangement of the lower electrode 22, the chuck support column 29B, the transition flange 16, and the side wall 14 improves RF path symmetry and increases conductance within the plasma chamber 11.

FIG. 7C is a side view of an embodiment of a plasma system 704 to illustrate fitting of the upper electrode system 12 to the side wall 14. Once the side wall 14 is fitted to the transition flange 16, the upper electrode assembly 12 that includes multiple upper electrode components, e.g., a gas feed, the upper electrode, an upper electrode extension, multiple dielectric rings, multiple electrode coils, a Faraday shield, etc., is fitted, e.g., bolted to, attached to, etc., to the top surface 19 of the side wall 14 to form the plasma chamber 11.

It should be noted that the upper electrode assembly 12 defines the plasma chamber 11 to be a capacitively coupled plasma (CCP) chamber or a transformer coupled plasma (TCP) chamber. For example, the same side wall 14 is fitted with an upper capacitive electrode or an upper inductive electrode. As another example, the same side wall 14 is fitted to the upper electrode assembly 12 to perform a conductor etch or a dielectric etch.

Between the pump 20A and the transition flange 16, a pendulum valve 722A is located. Moreover, between the pump 20B and the transition flange 16, a pendulum valve 722B is located. In some embodiments, each pendulum valve 722A and 722B prevents the plasma and/or the remnant materials of a plasma process from flowing back into the enclosure 25 of the plasma chamber 11. For example, each pendulum valve 722A and 722B is closed when corresponding one of the pumps 20A or 20B is not operating and is open when the corresponding pump 20A or 20B is operating.

In some embodiments, the pendulum valves 722A and 722B are located symmetric with respect to the center axis 1002. For example, the pendulum valve 722A is located at the same distance from the center axis 1002 as that of the pendulum valve 722B.

It should be noted that in some embodiments, an amount of power of the modified RF signal provided to the lower electrode 22 for processing, e.g., etching materials deposited on, depositing materials on, cleaning, etc., the wafer W of a diameter greater than 300 mm, e.g., a wafer between 300 mm and 450 mm, the 450 mm wafer, etc., is greater than that provided for processing a 300 mm wafer. The power is generated by one or more RF generators 51 (FIG. 1A).

Moreover, in various embodiments, a volume of the enclosure 25 (FIG. 1A) of the plasma chamber 11 for processing the wafer W of a diameter greater than 300 mm is greater, e.g., by three times, by 2.5 times, by 3.3 times, by 4 times, etc., than that provided for processing a 300 mm wafer. Moreover, in some embodiments, a flow rate associated with processing the wafer W of a diameter greater than 300 mm is greater, e.g., by a multiple in a range between two times and three times, etc., than a flow rate for processing a 300 mm wafer. For example, the one or more pumps having a combined capacity, measured in kiloliters/second, are used during processing the wafer W. The combined capacity is a multiple, e.g., two times, three times, a multiple in a range between two times and three times, etc., greater than a combined capacity of one or more pumps used for controlling conductance in a plasma chamber in which the 300 mm wafer is processed.

FIG. 8A is an isometric view of an embodiment of the side wall 14. The diameter 110 of the plasma chamber 11 is an inner diameter of the inner surface 104 of the side wall 14. The side wall 14 has the inner surface 104 and the outer surface 21.

In some embodiments, instead of a circular cross-section, the inner surface 104 of the side wall 14 has another cross-sectional shape, e.g., oval, polygonal, etc.

FIG. 8B is an isometric view of an embodiment of the transition flange 16. The transition flange 16 has the inner bottom surface 108, which is at a lower level compared to a top surface 810 of the transition flange 16. The top surface 810 is fitted with the bottom surface 17 (FIG. 1A) of the side wall 14. The openings 302, 27A, and 27B are formed within the inner bottom surface 108. Moreover, in various embodiments, the opening 302 is concentric with the center axis 1002. For example, the center axis 1002 passes through a center of the opening 302. As another example, the opening 302 is coaxial with the center axis 1002.

Figure 9:
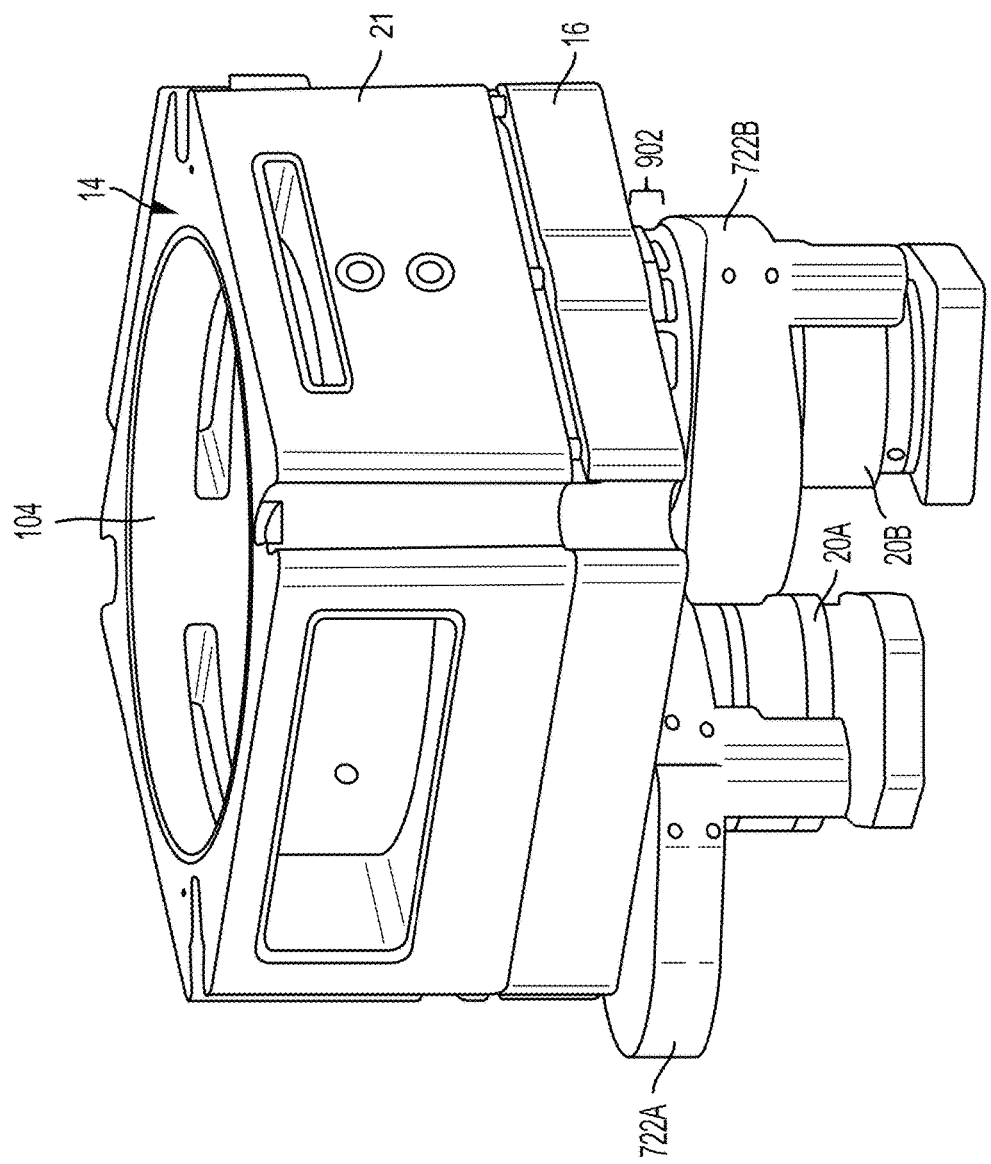
FIG. 9 is an isometric view of the side wall and the transition flange fitted with each other.

FIG. 9 is an isometric view of the side wall 14 and the transition flange 16. A spool flange 902 is included between the pendulum valve 722B and the transition flange 16. Similarly, in some embodiments, a spool flange is located between the pendulum valve 722A and the transition flange 16. A spool flange is used to attach a pendulum valve to the transition flange 16. In various embodiments, the spool flange is not used to attach a pendulum valve to the transition flange 16.

The outer surface 21 of the side wall 14 has a square cross-section the inner surface 104 of the side wall 14 has a circular cross-section. In some embodiments, both the inner surface 104 and the outer surface 21 have the same cross-sectional shape, e.g., square or circular or polygonal, etc.

Figure 10B:
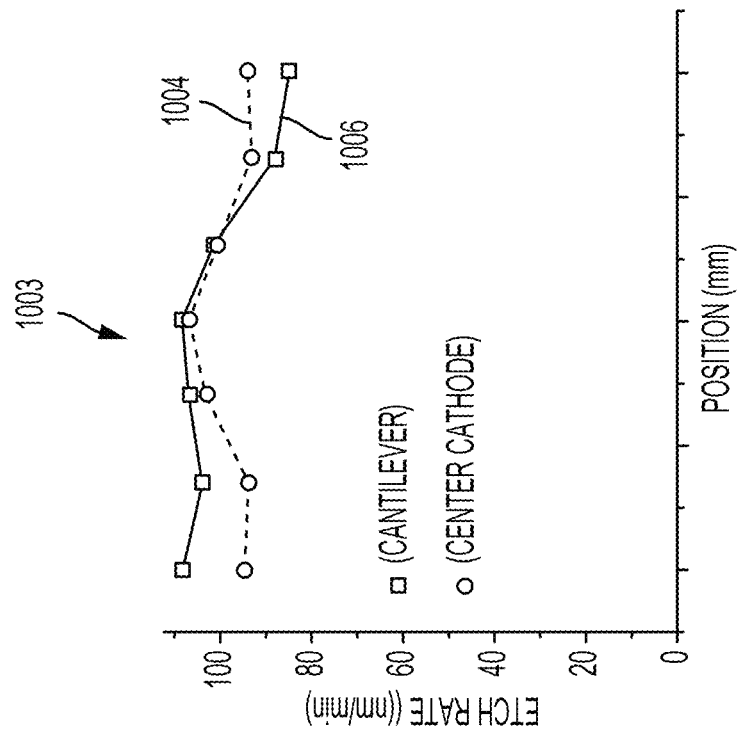
FIG. 10B is an embodiment of a graph to illustrate that with a use of the chuck support column that is vertically symmetric with respect to a center axis, etch rate is more uniform compared to a cantilevered stem support.
Figure 10A:
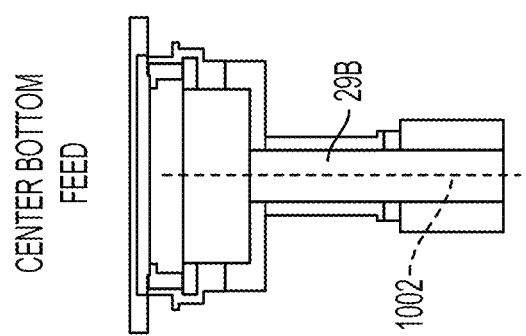
FIG. 10A is a side view of an embodiment of the chuck support column that is vertically mounted into the plasma chamber from a bottom portion of the plasma chamber.

FIG. 10A is a diagram used to illustrate an embodiment of the chuck support column 29B that is vertically mounted into the plasma chamber 11 from a bottom portion of the plasma chamber 11 versus the cantilevered stem support that is mounted via the side wall 14. As shown, the chuck support column 29B is straight and is not bent. Also, with use of the chuck support column 29B, a symmetric conductance of plasma is achieved within the plasma chamber 11. Moreover, etch rate uniformity increases when the chuck support column 29B is used compared to the cantilevered stem support. The chuck support column 29B includes the RF rod 30 (FIG. 1A), within the hollow space 33 (FIG. 1A) of the chuck support column 29B. Moreover, in some embodiments, the RF rod 30 is coaxial with respect to the chuck support column 29B and the center axis 1002. In various embodiments, the RF rod 30 is not bent to form an angle between portions of the RF rod 30. Moreover, the RF rod 30 is not inserted into the plasma chamber 11 via the side wall 14 of the plasma chamber 11. The chuck support column 29B provides an RF return path symmetry with respect to the center axis 1002 of the plasma chamber 11 to reduce, e.g., eliminate, etc., skews from non-uniform return paths.

FIG. 10B is a graph 1003 to illustrate that with the use of the chuck support column 29B that is vertically symmetric with respect to the center axis 1002, an etch rate is more uniform compared to the cantilevered stem support. The graph 1003 plots an etch rate versus a position of the lower electrode 22. As shown by a dashed plot 1004, which corresponds to the chuck support column 29B, an etch rate is symmetrical with respect to the lower electrode 22 compared an etch rate achieved with use of the cantilevered stem support. The etch rate achieved with the use of the cantilevered stem support is illustrated using a solid plot 1006.

Figure 11:
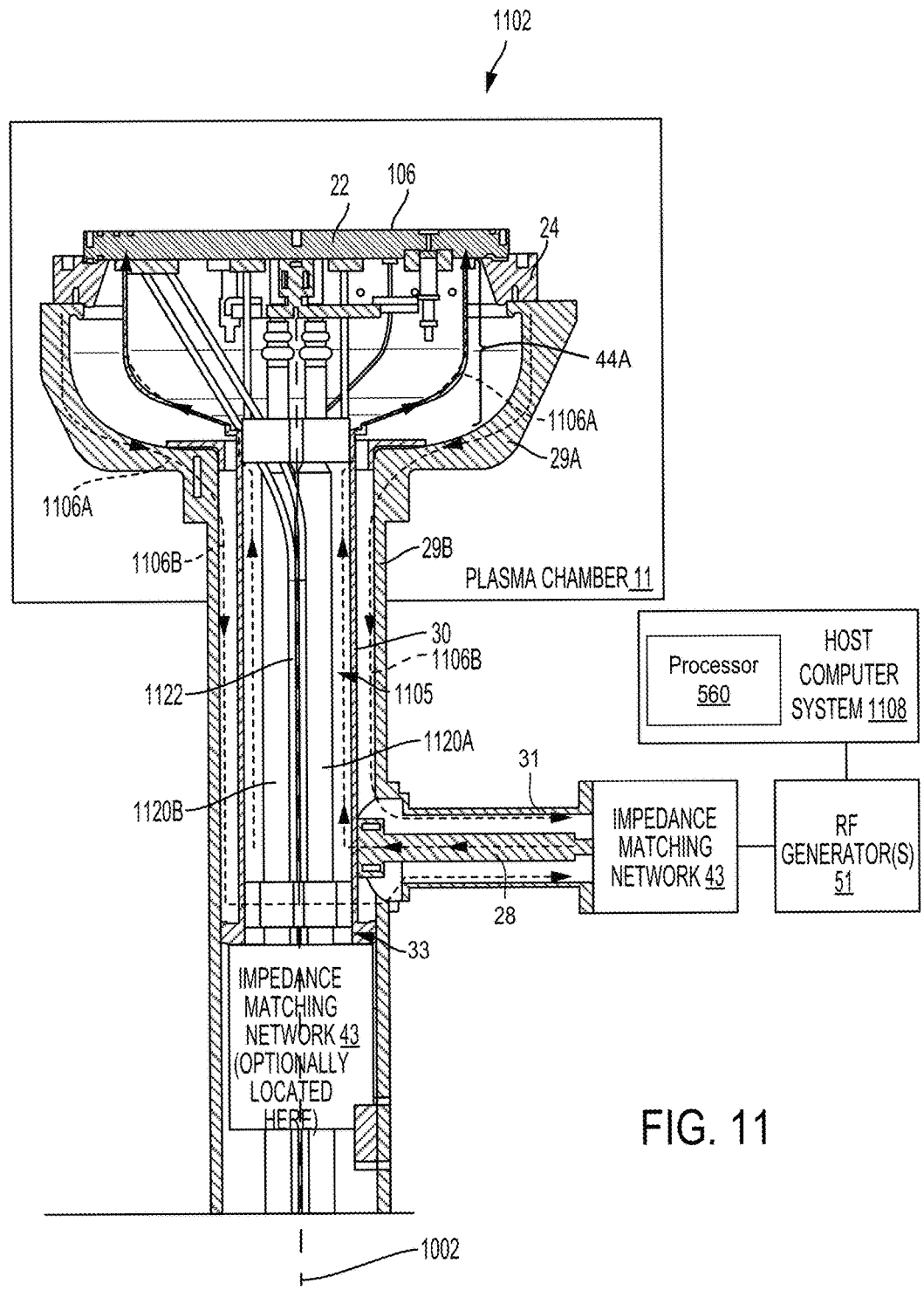
FIG. 11 is a diagram of an embodiment of a plasma system to illustrate a symmetric radio frequency (RF) supply path and a symmetric RF return path.

FIG. 11 is a diagram of an embodiment of a plasma system 1102 to illustrate a symmetric RF supply path 1106A and a symmetric RF return path 1106B. The plasma system 1102 includes the plasma chamber 11, the chuck support column 29B, the one or more RF generators 51, and a host computer system 1108. Examples of the host computer system 1108 include a desktop computer, a laptop computer, a smart phone, etc.

The one or more RF generators 51 are controlled by the host computer system 1108. For example, the one or more RF generators 51 receive frequency levels and power levels from the processor 560 of the host computer system 1108. The one or more RF generators 51 generate corresponding one or more RF signals having corresponding one or more frequencies and corresponding one or more power amounts, and provide the one or more RF signals to the impedance matching network 43. The impedance matching network 43 matches an impedance of a load, e.g., the RF transmission line, the plasma chamber 11, etc., with that of a source, e.g., the one or more RF generators 51, the corresponding one or more RF cables coupling the one or more RF generators 51 to the impedance matching network 43, etc., to generate the modified RF signal from the corresponding one or more RF signals received by the impedance matching network 43.

The modified RF signal is provided from the impedance matching network 43 to the lower electrode 22 to strike and/or maintain plasma within the plasma chamber 11. The plasma is struck and/or maintained when process gases are supplied to the plasma chamber 11. Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc.

The modified RF signal is supplied via the RF supply path 1106A that includes the RF rod 28, the RF rod 30, and the lower electrode 22. Also, a return RF signal, which is generated from the plasma within the plasma chamber 11, passes via the return RF path 1106B that includes the bowl-shaped structure 29A that supports the lower electrode 22, the chuck support column 29B that supports the bowl-shaped structure 29A, and the RF sheath 31 to reach the impedance matching network 43. The RF paths 1106A and 1106B are symmetric with respect to the center axis 1002 to improve conductance and uniformity of the conductance within the plasma chamber 1102.

Fluid lines 1120A and 1120B pass through a hollow space 1105 within the RF rod 30 for supplying a heating fluid to heat the lower electrode 22 or for supplying a cooling fluid to cool the lower electrode 22. The hollow space 1105 is surrounded by the RF rod 30. Moreover, a gas line 1122 is located within the hollow space 1105 of the RF rod 30 for supplying one or more gases, e.g., a cooling gas, helium gas, etc., to one or more gas inlets, e.g., slots for gas to enter into the lower electrode 22, etc., formed within the lower electrode 22 to cool the lower electrode 22. In various embodiments, a purge gas line is located within the hollow space 1105 of the RF rod 30 for purging one or more gases from the plasma chamber 11.

In some embodiments, instead of to a side of the chuck support column 29B, as shown, the impedance matching network 43 is located at a bottom part of the chuck support column 29B to provide further symmetry to the RF paths 1106A and 1106B to increase uniformity in conductance within the plasma chamber 11. For example, the impedance matching network 43 is located vertically, e.g., directly, etc., below the RF rod 30. As another example, the impedance matching network 43 is located below the RF rod 30 and a housing of the impedance matching network 43 is concentric with respect to the center axis 1002. As yet another example, the impedance matching network 43 is connected vertically below the RF rod 30 to a bottom end of the RF rod 30. To illustrate, the impedance matching network 43 is located within the hollow space 33 of the chuck support column 29B and is connected to the RF rod 30. A top end of the RF rod 30 is connected to the lower electrode 22 and is located opposite to the bottom end of the RF rod 30.

In various embodiments, in addition to the gas line 1122 and the fluid lines 1120A and 1120B, supply and/or receive lines are located within the hollow space 1105 of the RF rod 30. For example, one or more pneumatic supply lines, e.g., lift rods, etc., for controlling corresponding one or more lift pins to lift the wafer W from the top surface 106 of the lower electrode 22 are provided within the hollow space 1105 of the RF rod 30. As another example, one or more direct current (DC) lines, e.g., conductors, etc., for sensing a temperature of the lower electrode 22 measured by a thermocouple are provided within the hollow space 1105 of the RF rod 30. The thermocouple is placed proximate to the lower electrode 22, e.g., is within a pre-determined distance from the lower electrode 22, touches the lower electrode 22, etc. As yet another example, one or more AC lines, e.g., conductors, etc., for providing AC power to heaters, e.g., resistors, etc., within the lower electrode 22 are located within the hollow space 1105 of the RF rod 30. The location of the supply and receive lines, the gas line 1122, the purge gas line, and the fluid lines 1120A and 1120B within the hollow space 1105 of the RF rod facilitates achievement of symmetry of conductance and pressure within the plasma chamber 11.

In some embodiments, the fluid lines 1120A and 1120B are equidistant from the center axis 1002. In various embodiments, the gas line 1122 is concentric with respect to the center axis 1002. In several embodiments, all the supply and receive lines are located symmetric with respect to the center axis 1002. For example, the pneumatic lines for lifting or lowering the wafer W are located equidistant from the center axis 1002. As another example, the DC lines are located equidistant from the center axis 1002. As yet another example, the AC lines are located equidistant from the center axis 1002.

FIG. 12 is a diagram of an embodiment of the plasma system 1102 to illustrate a transport position of the lower electrode 22 during loading of the wafer W onto the lower electrode 22. The wafer W is loaded onto the lower electrode 22 via a slot 1702 within the side wall 14 of the plasma chamber 11. The position of the lower electrode 22 is lower than the position of the lower electrode 22 illustrated below in FIG. 13. For example, a gap 1204 between the lower electrode 22 and the upper electrode assembly 12 is greater during a transport position in which the wafer W is being loaded into the plasma chamber 11 compared to that when the wafer W is being processed within the plasma chamber 11.

A stationary support 1202, e.g., a bracket made from a metal, etc., supports the plasma chamber 11. For example, the stationary support 1202 is fitted to the transition flange 16 so that the stationary support 1202 abuts the transition flange 16 to support the plasma chamber 11. The linear rail 47 is attached, e.g., fitted to, bolted to, etc., to an edge E1 of the stationary support 1202. For example, the linear rail 47 is attached to the edge E1 of the stationary support 1202 that is angled with respect to an edge E2 of the stationary support 1202 to which the transition flange 16 is attached.

The processor 560 sends a control signal to the driver of the motor drive assembly 45. Upon receiving the control signal, the driver generates a current signal, which is provided to a stator of the motor. The stator generates an electric field, which rotates a rotor of the motor to rotate and/or move the connection mechanism 53. The rotation and/or movement of the connection mechanism 53 moves the linear rail 47 in the vertical direction to slide or roll against the stationary support 1202 in the vertical direction. For example, the linear rail 47 slides or rolls with respect to the edge E1. The sliding or rolling of the linear rail 47 moves the chuck support column 29B, which is attached, e.g., fitted to, bolted to, etc., to the linear rail 47, in the vertical direction. Moreover, the sliding or rolling of the linear rail 47 moves components, e.g., the RF rod 30, the fluid supply lines 1120A and 1120B, the purge gas line, the gas line 1122, the supply and/or receive lines (FIG. 11), etc., in the vertical direction. The movement of the chuck support column 29B moves the bowl-shaped structure 29A, which is attached to the chuck support column 29A. The lower electrode 22, which is support on the bowl-shaped structure 29A, moves in the vertical direction with the movement of the bowl-shaped structure 29A to change an amount of the gap 1204 between the lower electrode 22 and the upper electrode assembly 12.

It should be noted that the sliding or rolling of the linear rail 47 occurs when the stationary support 1202 is fixed with the transition flange 16 and when the side wall 14 is at a fixed location. For example, the linear rail 47 moves in the vertical direction with respect to the stationary support 1202 and the side wall 14.

FIG. 13 is a diagram of an embodiment of a plasma system 1102 to illustrate a position of the lower electrode 22 during processing, e.g., a process position, etc., of the wafer W. The position of the lower electrode 22 is higher than the position of the lower electrode 22 illustrated in FIG. 12 when the wafer W is transported into the plasma chamber 11. For example, an amount of the gap 1204 between the lower electrode 22 and the upper electrode assembly 12 is lower in the process position than an amount of the gap 1204 between the lower electrode 22 and the upper electrode assembly 12 in the transport position. The gap 1204 is confined by the upper electrode assembly 12, a C-shroud 1302, and the lower electrode 22 during processing of the wafer W. The lower electrode 22 is placed at the process position by the motor drive assembly 46 under control of the processor 560. The motor drive assembly 46 moves the chuck support column 29B up or down, e.g., in the vertical direction, etc., with respect to the stationary support 1202 to achieve the process position from the transport position.

It is noted that some or all of the above-described operations are performed with reference to a parallel plate plasma chamber, e.g., a capacitively coupled plasma chamber, etc., or with reference to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the 2 MHz RF generator, the 27 MHz RF generator, and/or the 60 MHz RF generator are coupled to an inductor within the ICP plasma reactor.

It should be noted that in some of the above-described embodiments, an RF signal is provided to the lower electrode 22 and the upper electrode is grounded. In various embodiments, an RF signal is provided to the upper electrode and the lower electrode 22 is grounded.

In some embodiments, the systems and methods, described herein, are practiced with various computer system configurations including hand-held hardware units, microprocessor systems, microprocessor-based or programmable consumer electronics, minicomputers, mainframe computers, and the like. In various embodiments, the systems and methods, described herein, are practiced in distributed computing environments where tasks are performed by remote processing hardware units that are linked through a computer network.

In some embodiments, a controller is part of the systems and methods, described herein. In various embodiments, the systems and methods, described herein, further include semiconductor processing equipment, including a processing tool or tools, chamber or chambers, a platform or platforms for processing, and/or specific processing components, the lower electrode 22, a gas flow system, etc. The controller includes electronics for controlling operation before, during, and after processing of the wafer W. The controller, depending on processing requirements, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of the plasma chamber 11 and other transfer tools.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for the wafer W. The operational parameters are, in some embodiments, a part of a recipe defined by process engineers to accomplish one or more processing steps during fabrication of one or more layers, materials, metals, oxides, silicon, silicon dioxide, surfaces, circuits, and/or dies of the wafer W.

The controller, in some embodiments, is a part of or coupled to a computer, e.g., the host computer system 1108 (FIG. 11) that is integrated with, coupled to the plasma system 10 (FIG. 1A), or otherwise networked to the plasma system 10. For example, the controller is in a "cloud" or all or a part of a fab host computer system, which allows for remote access for processing of the wafer W. The controller enables remote access to the plasma system 10 to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the plasma system 10 over a computer network, which includes a local network or the Internet. The remote computer includes a user interface that enables entry or programming of parameters and/or settings, which are then communicated to the plasma system 10 from the remote computer. In some examples, the controller receives instructions in the form of settings for processing the wafer W. It should be understood that the settings are specific to a type of process to be performed on the wafer W and parts of the plasma system 10 that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits in the plasma system 10 in communication with one or more integrated circuits located remotely (such as at a platform level or as part of the remote computer) that combine to control a process in the plasma chamber 11.

Without limitation, in various embodiments, the systems and methods, described herein, include a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers, e.g., the wafer W, etc.

It is further noted that although the above-described operations are described with reference to a parallel plate plasma chamber, e.g., a capacitively coupled plasma chamber, etc., and an ICP reactor, in some embodiments, the above-described operations apply to other types of plasma chambers, e.g., a transformer coupled plasma (TCP) reactor, conductor tools, dielectric tools, a plasma chamber including an electron cyclotron resonance (ECR) reactor, etc.

As noted above, depending on a process operation to be performed by the tool, the controller communicates with one or more of tool circuits or modules, tool components, cluster tools, tool interfaces, adjacent tools, neighboring tools, tools located throughout a factory, a main computer, another controller, or tools used in material transport that bring containers of wafers to and from tool locations, and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments, described above, relate to a hardware unit or an apparatus for performing these operations. The apparatus is specially constructed for a special purpose computer. When defined as the special purpose computer, the special purpose computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources, etc.

In several embodiments, the methods described herein, are fabricated as a computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), read-only memory (ROM), random access memory (RAM), compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in various embodiments, one or more features from any embodiment described above are combined with one or more features of any other embodiment without departing from a scope described in the various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A system for increasing uniformity in conductance within a plasma chamber, comprising:
   a side wall;
   a chuck support column;
   a lower electrode situated within an enclosure surrounded by the side wall, wherein the lower electrode is supported by the chuck support column; and
   a transition flange located below and adjacent to the side wall, wherein the transition flange includes a transition flange opening, wherein the transition flange opening is located coaxial with respect to the lower electrode such that the chuck support column passes via the transition flange opening and reduces impedance to a conductance of remnant materials within the plasma chamber from the lower electrode to one or more vacuum openings formed within the transition flange,
   wherein the side wall has a diameter greater than a diameter of an additional plasma chamber that is used to process a wafer having a diameter of 300 millimeters.

2. The system of claim 1, wherein the chuck support column includes a hollow space, the system further comprising:
   a radio frequency (RF) rod extending via the transition flange opening and the hollow space to the lower electrode within the plasma chamber to provide RF power to the lower electrode; or
   a gas line extending via the transition flange opening and a hollow space of the RF rod to one or more inlets formed within the lower electrode to supply one or more gases to change a temperature of the lower electrode; or
   a fluid line extending via the transition flange opening and the hollow space of the RF rod to the lower electrode to supply a fluid to heat or cool the lower electrode; or
   a conductor extending via the transition flange opening and the hollow space of the RF rod to a thermocouple that is proximate to the lower electrode to measure a temperature of the lower electrode; or a lift rod extending via the transition flange opening and the hollow space of the RF rod to a lift pin embedded within the lower electrode, wherein the lift pin is configured to be moved in a vertical direction with respect to the plasma chamber to change a height of a wafer with respect to the lower electrode.

3. The system of claim 1, wherein the one or more vacuum openings include a plurality of vacuum openings, the system further comprising a plurality of vacuum pumps interfaced with the plurality of vacuum openings, wherein the plurality of vacuum pumps are placed symmetric with respect to the lower electrode.

4. The system of claim 1, wherein the one or more vacuum openings include a plurality of vacuum openings, the system further comprising a plurality of baffles located on top of the plurality of vacuum openings, wherein the plurality of baffles are configured to vertically move with respect to the plurality of vacuum openings to control the conductance and a pressure at a region adjacent to the transition flange.

5. A system for increasing uniformity in conductance within a plasma chamber, comprising
 a side wall;
 a chuck support column;
 a lower electrode situated within an enclosure surrounded by the side wall, wherein the lower electrode is supported by the chuck support column;
 a grid fitted between the lower electrode and the side wall to control a conductance of remnant materials within the plasma chamber and a pressure within the plasma chamber; and
 a transition flange located below and adjacent to the side wall, wherein the transition flange includes a transition flange opening, wherein the transition flange opening is located coaxial with respect to the lower electrode such that the chuck support column passes via the transition flange opening and reduces impedance to the conductance of remnant materials from the lower electrode to one or more vacuum openings formed within the transition flange.

6. The system of claim 1, further comprising a bowl-shaped structure that is fitted on top of the chuck support column, wherein the bowl-shaped structure supports the lower electrode and is located between the chuck support column and the lower electrode.

7. The system of claim 1, further comprising a linear drive assembly configured to move the chuck support column in a vertical direction with respect to the side wall to control a gap formed between the lower electrode and an upper electrode of the plasma chamber.

8. The system of claim 1, wherein the chuck support column includes a hollow space, the system further comprising:
 a radio frequency (RF) rod extending via the transition flange opening and the hollow space to the lower electrode within the plasma chamber to provide RF power to the lower electrode; and
 an impedance matching network configured to be attached to a bottom of the RF rod.

9. A system for increasing uniformity in conductance within a plasma chamber, comprising:
 a side wall;
 a chuck support column;
 an inductively coupled plasma (ICP) circuit assembly placed on top of the side wall;
 a lower electrode situated within an enclosure surrounded by the side wall, wherein the lower electrode is supported by the chuck support column; and
 a transition flange located below and adjacent to the side wall, wherein the transition flange includes a transition flange opening, wherein the transition flange opening is located coaxial with respect to the lower electrode such that the chuck support column passes via the transition flange opening and reduces impedance to a conductance of remnant materials within the plasma chamber from the lower electrode to one or more vacuum openings formed within the transition flange,
 wherein the side wall has a diameter greater than a diameter of an additional plasma chamber that is used to process a wafer having a diameter of 300 millimeters.

10. The system of claim 9, wherein the chuck support column includes a hollow space, the system further comprising:
 a radio frequency (RF) rod extending via the transition flange opening and the hollow space to the lower electrode within the plasma chamber to provide RF power to the lower electrode; or
 a gas line extending via the transition flange opening and a hollow space of the RF rod to one or more inlets formed within the lower electrode to supply one or more gases to change a temperature of the lower electrode; or
 a fluid line extending via the transition flange opening and the hollow space of the RF rod to the lower electrode to supply a fluid to heat or cool the lower electrode; or
 a conductor extending via the transition flange opening and the hollow space of the RF rod to a thermocouple that is proximate to the lower electrode to measure a temperature of the lower electrode; or
 a lift rod extending via the transition flange opening and the hollow space of the RF rod to a lift pin embedded within the lower electrode, wherein the lift pin is configured to be moved in a vertical direction with respect to the plasma chamber to change a height of a wafer with respect to the lower electrode.

11. The system of claim 9, wherein the one or more vacuum openings include a plurality of vacuum openings, the system further comprising a plurality of vacuum pumps interfaced with the plurality of vacuum openings, wherein the plurality of vacuum pumps are placed symmetric with respect to the lower electrode.

12. The system of claim 9, wherein the one or more vacuum openings include a plurality of vacuum openings, the system further comprising a plurality of baffles located on top of the plurality of vacuum openings, wherein the plurality of baffles are configured to vertically move with respect to the plurality of vacuum openings to control the conductance and a pressure at a region adjacent to the transition flange.

13. A system for increasing uniformity in conductance within a plasma chamber, comprising
 a side wall;
 a chuck support column;
 an inductively coupled plasma (ICP) circuit assembly placed on top of the side wall;
 a lower electrode situated within an enclosure surrounded by the side wall, wherein the lower electrode is supported by the chuck support column;
 a grid fitted between the lower electrode and the side wall to control a conductance of remnant materials within the plasma chamber and a pressure within the plasma chamber; and
 a transition flange located below and adjacent to the side wall, wherein the transition flange includes a transition flange opening, wherein the transition flange opening is located coaxial with respect to the lower electrode such that the chuck support column passes via the transition flange opening and reduces impedance to the conductance of remnant materials from the lower electrode to one or more vacuum openings formed within the transition flange.

14. A system for increasing uniformity in conductance within a plasma chamber, comprising:
a side wall;
a chuck support column;
a capacitively coupled plasma (CCP) circuit assembly placed on top of the side wall;
a lower electrode situated within an enclosure surrounded by the side wall, wherein the lower electrode is supported by the chuck support column; and
a transition flange located below and adjacent to the side wall, wherein the transition flange includes a transition flange opening, wherein the transition flange opening is located coaxial with respect to the lower electrode such that the chuck support column passes via the transition flange opening and reduces impedance to a conductance of remnant materials within the plasma chamber from the lower electrode to one or more vacuum openings formed within the transition flange,
wherein the side wall has a diameter greater than a diameter of an additional plasma chamber that is used to process a wafer having a diameter of 300 millimeters.

15. The system of claim 14, wherein the chuck support column includes a hollow space, the system further comprising:
a radio frequency (RF) rod extending via the transition flange opening and the hollow space to the lower electrode within the plasma chamber to provide RF power to the lower electrode; or
a gas line extending via the transition flange opening and a hollow space of the RF rod to one or more inlets formed within the lower electrode to supply one or more gases to change a temperature of the lower electrode; or
a fluid line extending via the transition flange opening and the hollow space of the RF rod to the lower electrode to supply a fluid to heat or cool the lower electrode; or
a conductor extending via the transition flange opening and the hollow space of the RF rod to a thermocouple that is proximate to the lower electrode to measure a temperature of the lower electrode; or
a lift rod extending via the transition flange opening and the hollow space of the RF rod to a lift pin embedded within the lower electrode, wherein the lift pin is configured to be moved in a vertical direction with respect to the plasma chamber to change a height of a wafer with respect to the lower electrode.

16. The system of claim 14, wherein the one or more vacuum openings include a plurality of vacuum openings, the system further comprising a plurality of vacuum pumps interfaced with the plurality of vacuum openings, wherein the plurality of vacuum pumps are placed symmetric with respect to the lower electrode.

17. The system of claim 14, wherein the one or more vacuum openings include a plurality of vacuum openings, the system further comprising a plurality of baffles located on top of the plurality of vacuum openings, wherein the plurality of baffles are configured to vertically move with respect to the plurality of vacuum openings to control the conductance and a pressure at a region adjacent to the transition flange.

18. The system of claim 5, wherein the chuck support column includes a hollow space, the system further comprising:
a radio frequency (RF) rod extending via the transition flange opening and the hollow space to the lower electrode within the plasma chamber to provide RF power to the lower electrode; or
a gas line extending via the transition flange opening and a hollow space of the RF rod to one or more inlets formed within the lower electrode to supply one or more gases to change a temperature of the lower electrode; or
a fluid line extending via the transition flange opening and the hollow space of the RF rod to the lower electrode to supply a fluid to heat or cool the lower electrode; or
a conductor extending via the transition flange opening and the hollow space of the RF rod to a thermocouple that is proximate to the lower electrode to measure a temperature of the lower electrode; or
a lift rod extending via the transition flange opening and the hollow space of the RF rod to a lift pin embedded within the lower electrode, wherein the lift pin is configured to be moved in a vertical direction with respect to the plasma chamber to change a height of a wafer with respect to the lower electrode.

19. The system of claim 5, wherein the one or more vacuum openings include a plurality of vacuum openings, the system further comprising a plurality of vacuum pumps interfaced with the plurality of vacuum openings, wherein the plurality of vacuum pumps are placed symmetric with respect to the lower electrode.

20. The system of claim 5, wherein the one or more vacuum openings include a plurality of vacuum openings, the system further comprising a plurality of baffles located on top of the plurality of vacuum openings, wherein the plurality of baffles are configured to vertically move with respect to the plurality of openings to control the conductance and a pressure at a region adjacent to the transition flange.

21. The system of claim 5, further comprising a bowl-shaped structure that is fitted on top of the chuck support column, wherein the bowl-shaped structure supports the lower electrode and is located between the chuck support column and the lower electrode.

22. The system of claim 5, further comprising a linear drive assembly configured to move the chuck support column in a vertical direction with respect to the side wall to control a gap formed between the lower electrode and an upper electrode of the plasma chamber.

23. The system of claim 13, wherein the chuck support column includes a hollow space, the system further comprising:
a radio frequency (RF) rod extending via the transition flange opening and the hollow space to the lower electrode within the plasma chamber to provide RF power to the lower electrode; or
a gas line extending via the transition flange opening and a hollow space of the RF rod to one or more inlets formed within the lower electrode to supply one or more gases to change a temperature of the lower electrode; or
a fluid line extending via the transition flange opening and the hollow space of the RF rod to the lower electrode to supply a fluid to heat or cool the lower electrode; or a conductor extending via the transition flange opening and the hollow space of the RF rod to a thermocouple that is proximate to the lower electrode to measure a temperature of the lower electrode; or a lift rod extending via the transition flange opening and the hollow space of the RF rod to a lift pin embedded within the lower electrode, wherein the lift pin is configured to be moved in a vertical direction with respect to the plasma chamber to change a height of a wafer with respect to the lower electrode.

24. The system of claim 13, wherein the one or more vacuum openings include a plurality of vacuum openings, the system further comprising a plurality of vacuum pumps interfaced with the plurality of vacuum openings, wherein the plurality of vacuum pumps are placed symmetric with respect to the lower electrode.

25. The system of claim 13, wherein the one or more vacuum openings include a plurality of vacuum openings, the system further comprising a plurality of baffles located on top of the plurality of vacuum openings, wherein the plurality of baffles are configured to vertically move with respect to the plurality of vacuum openings to control the conductance and a pressure at a region adjacent to the transition flange.

* * * * *